US011128279B2

(12) United States Patent
Yamamoto

(10) Patent No.: US 11,128,279 B2
(45) Date of Patent: Sep. 21, 2021

(54) ACOUSTIC WAVE RESONATOR, ACOUSTIC WAVE FILTER, MULTIPLEXER, COMMUNICATION APPARATUS, AND METHOD DESIGNING ACOUSTIC WAVE RESONATOR

(71) Applicant: KYOCERA Corporation, Kyoto (JP)

(72) Inventor: Daisuke Yamamoto, Kizugawa (JP)

(73) Assignee: KYOCERA Corporation, Kyoto (JP)

(*) Notice: Subject to any disclaimer, the term of this patent is extended or adjusted under 35 U.S.C. 154(b) by 650 days.

(21) Appl. No.: 15/770,744

(22) PCT Filed: Oct. 19, 2016

(86) PCT No.: PCT/JP2016/080952
§ 371 (c)(1),
(2) Date: Apr. 24, 2018

(87) PCT Pub. No.: WO2017/073425
PCT Pub. Date: May 4, 2017

(65) Prior Publication Data
US 2018/0323769 A1    Nov. 8, 2018

(30) Foreign Application Priority Data

Oct. 30, 2015    (JP) .............................. JP2015-214854

(51) Int. Cl.
*H03H 9/02*    (2006.01)
*H03H 9/64*    (2006.01)
*H03H 9/145*    (2006.01)
*H03H 9/25*    (2006.01)

(52) U.S. Cl.
CPC .......... *H03H 9/64* (2013.01); *H03H 9/02015* (2013.01); *H03H 9/02559* (2013.01); *H03H 9/02574* (2013.01); *H03H 9/02992* (2013.01); *H03H 9/14538* (2013.01); *H03H 9/25* (2013.01); *H03H 9/6483* (2013.01)

(58) Field of Classification Search
CPC .. H03H 9/02015; H03H 9/02992; H03H 9/25; H03H 9/64
See application file for complete search history.

(56) References Cited

U.S. PATENT DOCUMENTS

2015/0070227 A1    3/2015  Kishino et al.
2020/0036360 A1*   1/2020  Tanaka ..................... H03H 9/64

FOREIGN PATENT DOCUMENTS

| JP | 55143814 A | * 11/1980 | ......... H03H 9/02015 |
|---|---|---|---|
| JP | 2012-109399 A | 6/2012 | |
| JP | 2013-81068 A | 5/2013 | |
| JP | 5436729 B1 | 12/2013 | |
| JP | 2014082700 A | * 5/2014 | |
| JP | 2014-160888 A | 9/2014 | |
| JP | 2014-229916 A | 12/2014 | |

* cited by examiner

*Primary Examiner* — J. San Martin
(74) *Attorney, Agent, or Firm* — Procopio, Cory, Hargreaves & Savitch LLP

(57) ABSTRACT

An acoustic wave resonator includes a piezoelectric substrate and an IDT electrode on the top surface of the piezoelectric substrate. Between a resonance frequency and anti-resonance frequency due to a surface acoustic wave, one to four of at least one of resonance frequencies or anti-resonance frequencies due to bulk waves are located.

21 Claims, 14 Drawing Sheets

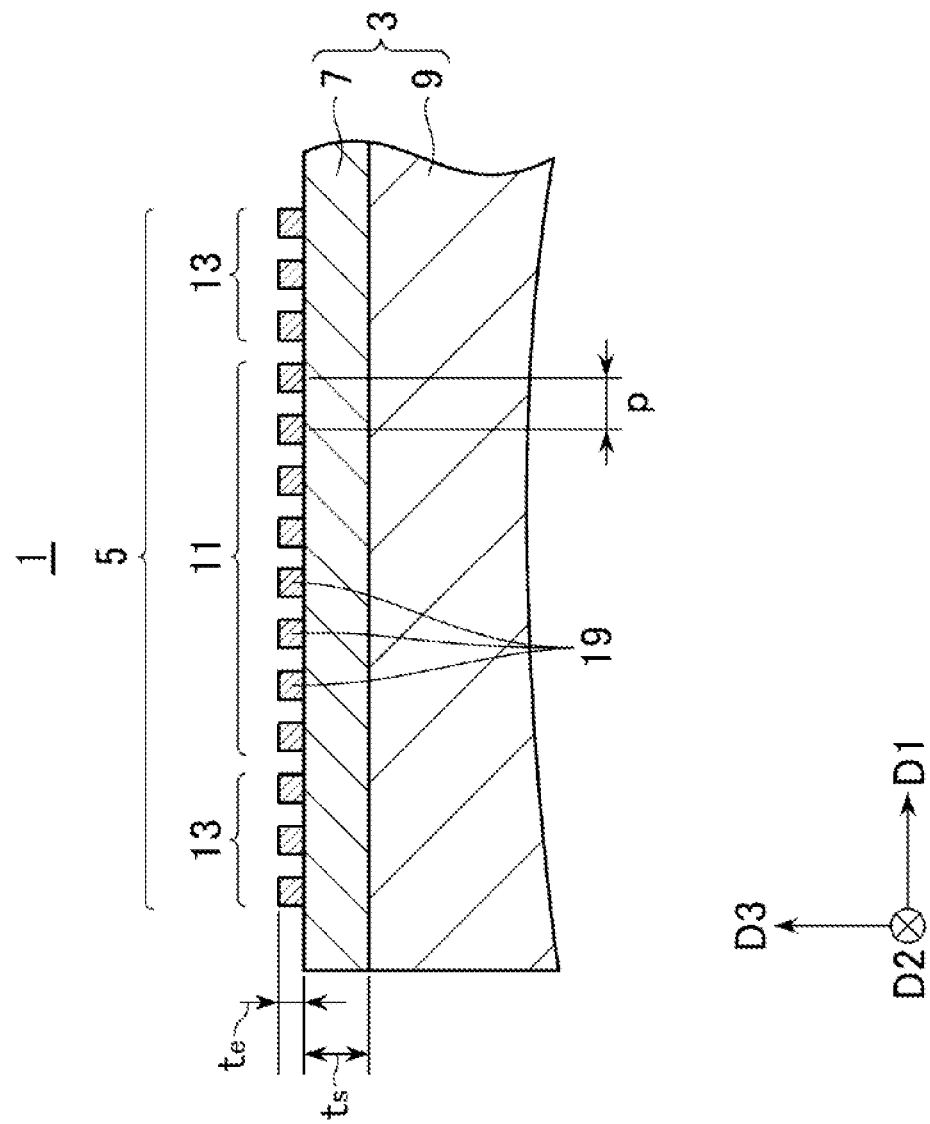

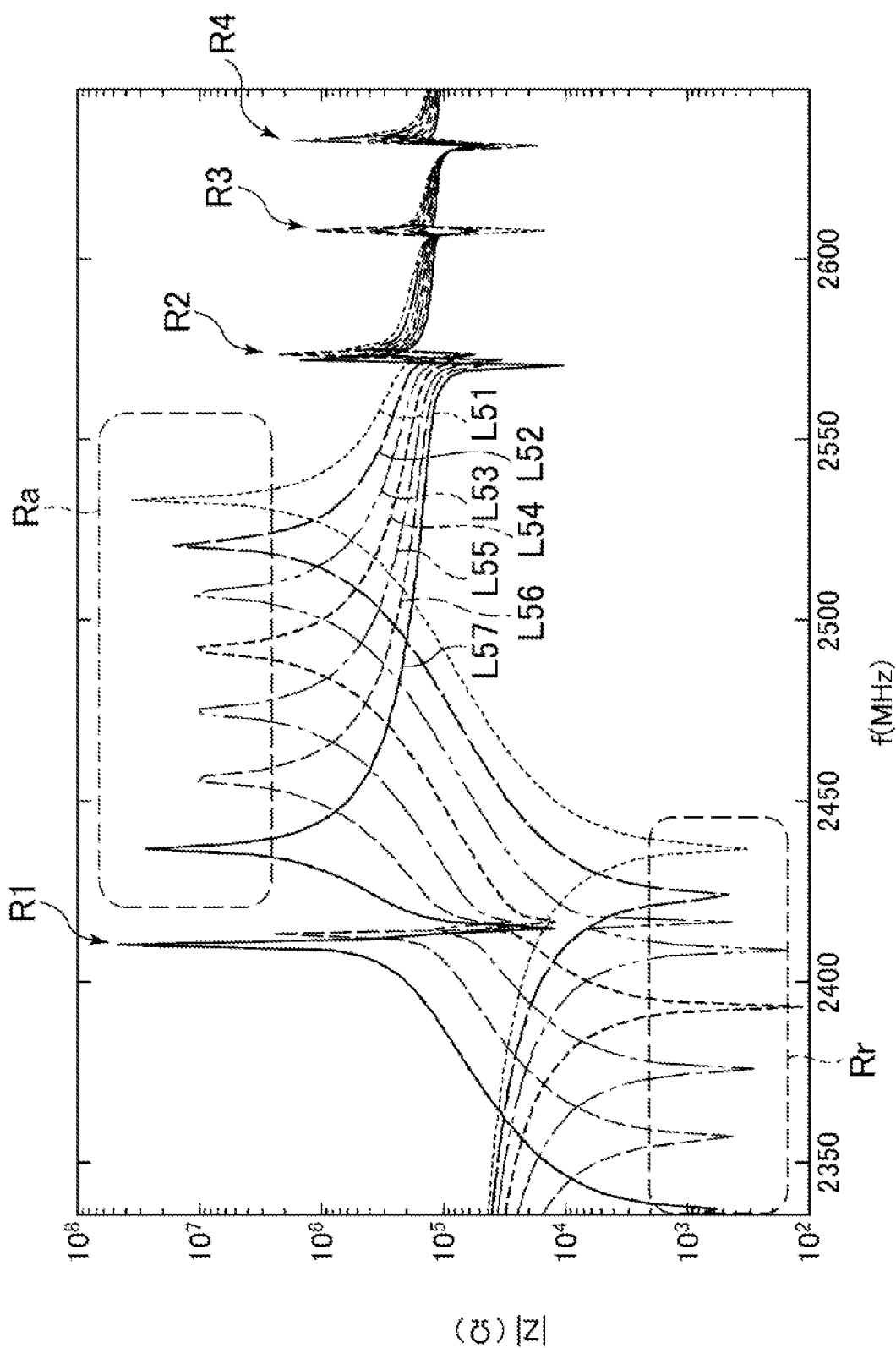

ACOUSTIC WAVE RESONATOR, ACOUSTIC WAVE FILTER, MULTIPLEXER, COMMUNICATION APPARATUS, AND METHOD DESIGNING ACOUSTIC WAVE RESONATOR

TECHNICAL FIELD

The present disclosure relates to an acoustic wave resonator using an acoustic wave, an acoustic wave filter having the acoustic wave resonator, a multiplexer having the acoustic wave filter, a communication apparatus having the multiplexer, and a method for designing the acoustic wave resonator.

BACKGROUND ART

Known in the art is a surface acoustic wave resonator (SAW resonator) having a piezoelectric substrate and an IDT (InterDigital Transducer) electrode provided on the top surface of the piezoelectric substrate and exciting a surface acoustic wave (SAW) (for example Patent Literatures 1 and 2).

In Patent Literature 1, a capacity element is connected parallel to the IDT electrode. It is known that by providing such a capacity element, the anti-resonance frequency of a SAW can be moved to a low frequency side and a difference of frequencies from the resonance frequency to the anti-resonance frequency can be made narrower. Note that, in Patent Literature 1, a reflector is dually used as a capacity element so as to reduce the size of the SAW resonator.

In Patent Literature 2, the piezoelectric substrate is not used for the SAW resonator alone. A bonded substrate formed by bonding together a piezoelectric substrate and a support substrate having a smaller thermal expansion coefficient compared with the piezoelectric substrate is used for the SAW resonator. By utilizing such a bonded substrate, for example, a change of electrical characteristics of the SAW resonator due to temperature is compensated for. Patent Literature 2 discloses that spurious emission is generated if using a bonded substrate and that the factor behind that spurious emission is a bulk wave. Further, Patent Literature 2 proposes an electrode structure for cancelling out bulk waves by each other.

CITATION LIST

Patent Literature

Patent Literature 1: Japanese Patent No. 5436729B2
Patent Literature 2: Japanese Patent Publication No. 2014-229916A

SUMMARY OF INVENTION

An acoustic wave resonator according to one aspect of the present disclosure includes a piezoelectric substrate and an IDT electrode on a top surface of the piezoelectric substrate. Between a resonance frequency and anti-resonance frequency due to the surface acoustic wave, one to four of at least one of resonance frequencies or anti-resonance frequencies due to bulk waves are located.

An acoustic wave filter according to one aspect of the present disclosure includes a piezoelectric substrate, a support substrate bonded to a bottom surface of the piezoelectric substrate, and a plurality of IDT electrodes on a top surface of the piezoelectric substrate. The plurality of IDT electrodes include a first IDT electrode and a second IDT electrode which is different in thickness from the first IDT electrode.

A multiplexer according to one aspect of the present disclosure includes an antenna terminal, a transmission filter which filters a transmission signal and outputs the result to the antenna terminal, and a receiving filter which filters the reception signal from the antenna terminal. At least one of the transmission filter and the receiving filter includes the above acoustic wave filter.

A communication apparatus according to one aspect of the present disclosure includes an antenna, a multiplexer described above in which the antenna terminal is connected to the antenna, and an IC connected to the transmission filter and the receiving filter.

A method designing an acoustic wave resonator according to one aspect of the present disclosure, specifies a thickness of electrode fingers of an IDT electrode whereby in a case where a pitch of the electrode fingers is a predetermined initial value, a resonance frequency and an anti-resonance frequency due to a surface acoustic wave are located on the two sides of at least one of a resonance frequency and anti-resonance frequency due to a bulk wave; and specifies the pitch of the electrode fingers by which the above one frequency coincides with a predetermined target frequency by the thickness of the electrode fingers specified in the electrode thickness setting step.

BRIEF DESCRIPTION OF DRAWINGS

FIG. 2 A cross-sectional view taken along a II-II line in FIG. 1.

FIG. 4 A graph showing an influence of a thickness of an IDT electrode exerted upon a resonance characteristic.

DESCRIPTION OF EMBODIMENTS

<Acoustic Wave Resonator>

Figure 1:
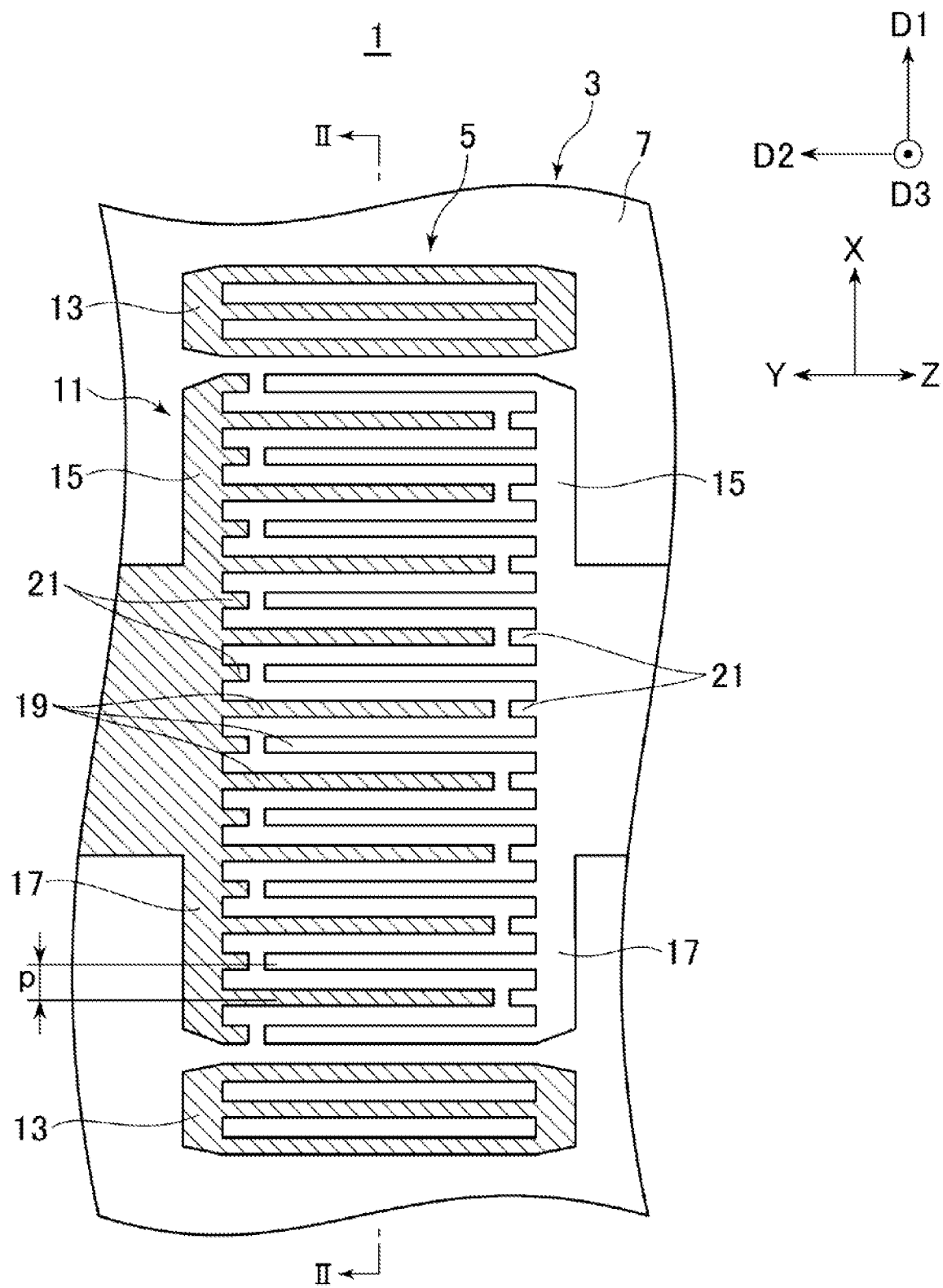
FIG. 1 A plan view showing the configuration of an acoustic wave resonator according to an embodiment of the present disclosure.

Below, an acoustic wave resonator according to an embodiment of the present disclosure will be explained with reference to the drawings. Note that, the drawings used in the following explanation are schematic ones. Size ratios etc. in the drawings do not always coincide with the actual ones.

In the acoustic wave resonator, any direction may be defined as "above" or "below". In the following description, however, for convenience, an orthogonal coordinate system comprised of a D1 axis, D2 axis, and D3 axis will be defined, and the "top surface", "bottom surface", and other terms will be sometimes used while using the positive side of the D3 axis as "above".

(Outline of Configuration of Acoustic Wave Resonator)

FIG. 1 is a plan view showing the configuration of an acoustic wave resonator 1 according to one embodiment of the present disclosure. FIG. 2 is a cross-sectional view taken along the II-II line in FIG. 1. However, in FIG. 2, the number of the electrode fingers explained later is drawn smaller than that in FIG. 1.

The acoustic wave resonator 1 is a resonator based on a new principle of utilizing a SAW and bulk wave as acoustic waves. However, the configuration of the acoustic wave resonator 1, except for various dimensions etc., may be basically made the same as the configuration of a SAW resonator. Specifically, this is as follows.

The acoustic wave resonator 1 for example has a bonded substrate 3 and an electrode portion 5 configured on the top surface of the bonded substrate 3. Although not particularly shown, the acoustic wave resonator 1, other than these, may have a protective layer configured by $SiO_2$ etc. covering the electrode portion 5 and so on.

The bonded substrate 3 for example has a piezoelectric substrate 7 and a support substrate 9 (FIG. 2) bonded to the bottom surface of the piezoelectric substrate 7. Note that, FIG. 1 shows an example of an X-axis, Y-axis, and Z-axis of the piezoelectric substrate 7.

The piezoelectric substrate 7 is for example configured by a single crystal substrate having a piezoelectric characteristic. The single crystal substrate is for example comprised of lithium tantalate ($LiTaO_3$), lithium niobate ($LiNbO_3$), or quartz crystal ($SiO_2$). The cut angle may be suitably set. For example, the lithium tantalate is a 42°±10° Y-plate or 0°±10° X-plate etc. The lithium niobate may be a 128°±10° Y-plate or 64°±10° Y-plate etc.

Note that, below, an aspect where the piezoelectric substrate 7 is configured by a 38° to 48° Y-plate made of lithium tantalate will be mainly explained as an example. Unless otherwise indicated, the results of simulation etc. explained later are for a 38° to 48° Y-plate made of lithium tantalite. Describing this for confirmation, in this Y-plate, the major surfaces (upper surface and lower surface) are perpendicular to a Y'-axis (not shown) obtained by rotation around the X-axis from the Y-axis to the Z-axis by an angle of 38° to 48°.

The thickness $t_s$ (FIG. 2) of the piezoelectric substrate 7 is for example constant over the entire of the piezoelectric substrate 7 in the surface direction. As will be explained later, in the acoustic wave resonator 1 in the present embodiment, unlike a SAW resonator, this thickness $t_s$ also becomes a parameter defining the resonator characteristics.

The support substrate 9 is for example formed by a material having a smaller thermal expansion coefficient than that of the material of the piezoelectric substrate 7. Due to this, a change due to temperature of electrical characteristics of the acoustic wave resonator 1 can be compensated for. As such a material, for example, silicon or other semiconductor, sapphire or other single crystal, and an aluminum oxide sintered body or other ceramic may be mentioned. Note that, the support substrate 9 may also be obtained by stacking a plurality of layers made of materials which are different from each other.

The thickness of the support substrate 9 is for example constant over the entire of the support substrate 9 in the surface direction. The size thereof may be suitably set in accordance with specifications etc. demanded from the acoustic wave resonator 1. For example, the thickness of the support substrate 9 is made thicker than the thickness of the piezoelectric substrate 7. In this case, for example, the action of temperature compensation becomes stronger, and the strength of the piezoelectric substrate 7 is reinforced. As an example, the thickness of the support substrate 9 is 100 μm to 300 μm. The planar shape and various dimensions of the support substrate 9 are for example equal to those of the piezoelectric substrate 7.

The piezoelectric substrate 7 and the support substrate 9 are bonded to each other through for example a not shown bonding layer. The material of the bonding layer may be an organic material or may be inorganic material. As the organic material, for example, a thermosetting resin or other resin may be mentioned. As an inorganic material, for example, $SiO_2$ may be mentioned. Further, the piezoelectric substrate 7 and the support substrate 9 may be bonded to each other by so-called "direct bonding" activating the bonding surfaces by plasma or the like, then bonding them together without a bonding layer.

The configuration of the electrode portion 5 is for example made the same as the configuration of the electrode portion for a so-called 1-port SAW resonator. That is, the electrode portion 5 has an IDT electrode 11 and a pair of reflectors 13 positioned on the two sides of the IDT electrode 11.

The IDT electrode 11 is configured by conductive patterns (conductive layer) formed on the top surface of the piezoelectric substrate 7 and has a pair of comb-shaped electrodes 15 as shown in FIG. 1.

The pair of comb-shaped electrodes 15 for example have bus bars 17 (FIG. 1) facing each other, pluralities of electrode fingers 19 extending from the bus bars 17 in the facing directions of the bus bars 17, and dummy electrodes 21 projecting from the bus bars 17 between pluralities of electrode fingers 19. Further, the pair of comb-shaped electrodes 15 are arranged so that the pluralities of electrode fingers 19 intermesh (cross) with each other.

The bus bars 17 are for example substantially formed in a long shapes so as to linearly extend in the direction of propagation of the SAW (D1-axis direction, X-axis direction) with constant widths. The bus bars 17 of the pair of comb-shaped electrodes 15 face each other in the direction (D2-axis direction) crossing the direction of propagation of the SAW.

The pluralities of electrode fingers 19 are for example substantially formed in long shapes so as to linearly extend in the direction (D2-axis direction) perpendicular to the direction of propagation of the SAW with constant widths and are arranged at substantially constant intervals in the direction of propagation of the SAW (D1-axis direction).

In general, in the SAW resonator, the pluralities of electrode fingers 19 in the pair of comb-shaped electrodes 15 are provided so that their pitch "p" (for example distance between the centers of the electrode fingers 19) becomes equal to a half wavelength (λ/2) of the wavelength λ of the SAW at the frequency at which resonation is desired. On the other hand, as will be understood from the explanation given later, in the acoustic wave resonator in the present embodiment, the pitch "p" does not always become such a size. Note that, the wavelength λ of the SAW is for example 1.5 μm to 6 μm.

In the same way as the SAW resonator, in portions of the pluralities of electrode fingers 19, the pitch "p" thereof may be made relatively small. Conversely, it may be made relatively large as well. Further, so-called thinning may be carried out as well so that the pitch "p" becomes a whole multiple of the normal pitch "p". Note that, in the present embodiment, when simply referring to the pitch "p", unless otherwise indicated, the pitch "p" of a portion (major portion of the plurality of electrode fingers 19) excluding special portions as described above (narrow pitch portion, wide pitch portion, or thinned out portion) or a mean value thereof is meant. Further, in the same way, when simply referring to electrode fingers 19, unless otherwise indicated, this designates the electrode fingers 19 other than at the special portions.

The numbers, lengths (D2-axis direction), and widths (D1-axis direction) of the pluralities of electrode fingers 19 may be suitably set in accordance with the electrical characteristics etc. demanded from the acoustic wave resonator 1. In setting these, as will be understood from the explanation which will be given later, basically the same thinking as in a SAW resonator can be utilized. As one example, the numbers of electrode fingers 19 are 100 to 400. The lengths and widths of the electrode fingers 19 are for example equal to each other among the plurality of electrode fingers 19.

The dummy electrodes 21 for example project from the bus bar 17 at intermediate positions of the pluralities of electrode fingers 19 in one comb-shaped electrode 15. The tip ends thereof face the tip ends of the electrode fingers 19 of the other comb-shaped electrode 15 over a gap. The lengths and widths of the dummy electrodes 21 are for example equal to each other among the plurality of dummy electrodes 21.

The reflectors 13 are for example configured by conductive patterns (conductive layer) formed on the top surface of the piezoelectric substrate 7 and are formed in lattice shapes when viewed on a plane. That is, the reflectors 13 have pairs of bus bars (notation omitted) which face each other in the direction crossing the direction of propagation of the SAW and pluralities of strip electrodes (notation omitted) which extend in the direction (D2-axis direction) perpendicular to the direction of propagation of the acoustic wave (for example SAW) between these bus bars.

The pluralities of strip electrodes in the reflectors 13 are aligned in the D1-axis direction so as to continue from the array of the pluralities of electrode fingers 19. The numbers and widths of the strip electrodes may be suitably set in accordance with the electrical characteristics etc. demanded from the acoustic wave resonator 1. The pitch of the pluralities of strip electrodes is for example equal to the pitch of the pluralities of electrode fingers 19. Further, the intervals between the strip electrodes at the end parts of the reflectors 13 and the electrode fingers 19 at the end parts of the IDT electrode 11 are for example equal to the pitch "p" of the pluralities of electrode fingers 19 (may be whole multiple of the pitch "p" as well).

The conductive layer configuring the IDT electrode 11 and reflectors 13 etc. is for example configured by a metal. As this metal, for example Al or an alloy containing Al as a main ingredient (Al alloy) may be mentioned. The Al alloy is for example an Al—Cu alloy. Note that, the conductive layer may be configured by a plurality of metal layers as well.

The thickness $t_e$ (FIG. 2) of the IDT electrode 11 and the reflectors 13 is for example constant over their entire regions. As will be explained later, in the acoustic wave resonator 1 in the present embodiment, this thickness $t_e$ is utilized as a parameter defining the resonator characteristics.

In the acoustic wave resonator 1 having the configuration as described above, first, the same action as that in a SAW resonator is caused. Specifically, when an electrical signal is input to one comb-shaped electrode 15 and voltage is applied to the piezoelectric substrate 7 by the pluralities of electrode fingers 19, in the vicinity of the top surface of the piezoelectric substrate 7, a SAW propagating along the top surface is induced. This SAW is reflected by the pluralities of electrode fingers 19 and pluralities of strip electrodes in the reflectors 13. As a result, a standing wave of a SAW having a pitch "p" of the pluralities of electrode fingers 19 as substantially the half wavelength (λ/2) is formed. The standing wave generates an electrical charge (electrical signal having the same frequency as that of the standing wave) on the top surface of the piezoelectric substrate 7. That electrical signal is extracted by the plurality of electrode fingers 19 in the other comb-shaped electrode 15.

Further, in the acoustic wave resonator 1, when voltage is applied to the piezoelectric substrate 7 by the pluralities of electrode fingers 19 as described above, not only a SAW, but also a bulk wave propagating inside the piezoelectric substrate 7 are excited. Patent Literature 2 discloses that the bulk wave becomes a factor of spurious emission if the piezoelectric substrate is thin like the piezoelectric substrate 7 in the bonded substrate 3. In the present embodiment, this bulk wave spurious emission is utilized for making the difference Δf between the resonance frequency and the anti-resonance frequency narrower.

(Principle of New Acoustic Wave Resonator)

Figure 3A:
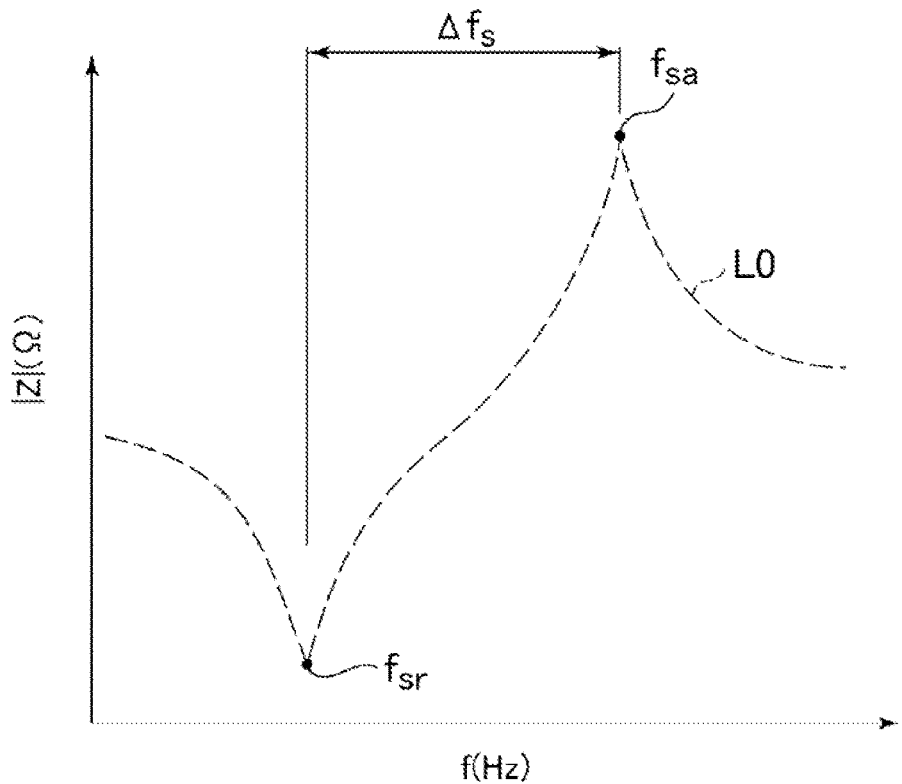
FIG. 3A and FIG. 3B are graphs for explaining a principle of the acoustic wave resonator in FIG. 1.
Figure 3B:
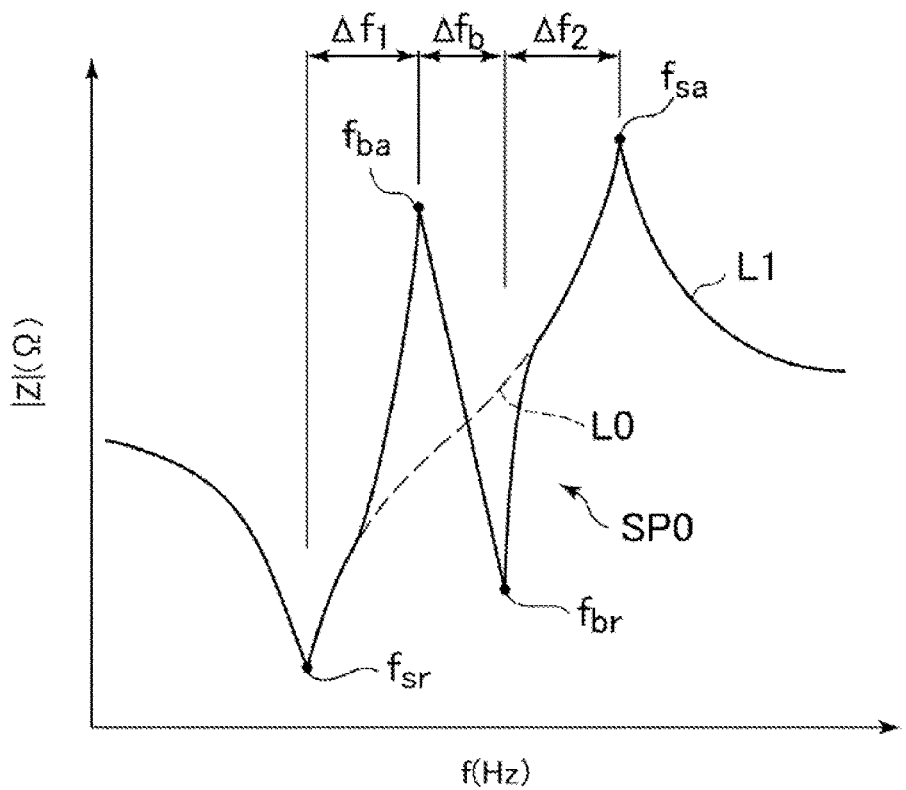

FIG. 3A and FIG. 3B are diagrams for explaining the principle of the acoustic wave resonator 1. In FIG. 3A and FIG. 3B, the abscissas indicate frequencies "f" (Hz), and the ordinates indicate the absolute values |Z| (Ω) of impedance.

Note that, in the following explanation, for convenience, sometimes use will be made of the same notation for a resonance point and resonance frequency. In the same way, sometimes use will be made of the same notation for an anti-resonance point and anti-resonance frequency.

In FIG. 3A, a broken line L0 indicates the resonance characteristics in a usual SAW resonator different from the acoustic wave resonator 1 in the present embodiment. As is well known, in a SAW resonator, a SAW resonance point $f_{sr}$ having an impedance taking the minimum value and a SAW anti-resonance point $f_{sa}$ having an impedance taking the maximum value appear. The SAW anti-resonance frequency $f_{sa}$ is higher than the SAW resonance frequency $f_{sr}$. Further, if the frequency difference $\Delta f_s$ between the two ($=f_{sa}-f_{sr}$) becomes narrow, for example, when configuring a filter by a SAW resonator, the rise or fall of an amount of attenuation with respect to a change of the frequency becomes sharp, so the filter characteristics are improved.

Note that, this SAW resonator is explained by taking as an example a case where there is no bulk wave spurious emission between the SAW resonance point $f_{sr}$ and the SAW anti-resonance point $f_{sa}$.

In FIG. 3B, a solid line L1 indicates the resonance characteristic in the acoustic wave resonator 1 in the present embodiment. In the acoustic wave resonator 1, due to the piezoelectric substrate 7 being thin, a bulk wave spurious emission SPO appears. In the bulk wave spurious emission SPO, for example, a bulk wave resonance point $f_{br}$ having an impedance taking the minimum value and a bulk wave anti-resonance point $f_{ba}$ having an impedance taking the maximum value appear. The relationship between the bulk wave resonance frequency $f_{br}$ and the bulk wave anti-resonance frequency $f_{ba}$ with respect to their heights is for example inverse to the relationship between the SAW resonance frequency $f_{sr}$ and the SAW anti-resonance frequency $f_{sa}$ with respect to their heights. That is, the bulk wave resonance frequency $f_{br}$ is higher than the bulk wave anti-resonance frequency $f_{ba}$. Further, the frequency difference $\Delta f_b$ between the two $(=f_{br}-f_{ba})$ is for example narrower compared with the difference $\Delta f_s$ of frequencies in the SAW.

Here, when suitably setting the thickness $t_s$ of the piezoelectric substrate 7 and thickness $t_e$ of the electrode portion 5 and also the interval between the electrode fingers and so on, the bulk wave spurious emission SPO (bulk wave resonance frequency $f_{br}$ and bulk wave anti-resonance frequency $f_{ba}$) is positioned between the SAW resonance frequency $f_{sr}$ and the SAW anti-resonance frequency $f_{sa}$. As a result, by the SAW resonance point $f_{sr}$ and bulk wave anti-resonance point $f_{ba}$, the resonance point and anti-resonance point of the frequency difference $\Delta f_1$ $(=f_{ba}-f_{sr})$ is configured. In the same way, by the bulk wave resonance point $f_{br}$ and SAW anti-resonance point $f_{sa}$, the resonance point and anti-resonance point of the frequency difference $\Delta f_2$ $(=f_{sa}-f_{br})$ are configured.

Therefore, in the acoustic wave resonator 1 in the present embodiment, the combination of the SAW resonance point $f_{sr}$ and bulk wave anti-resonance point $f_{ba}$ (difference $\Delta f_1$ of frequencies) or the combination of the bulk wave resonance point $f_{br}$ and SAW anti-resonance point $f_{sa}$ (difference $\Delta f_2$ of frequencies) described above is utilized as the combination of the normal resonance point and anti-resonance point. The differences $\Delta f_1$ and $\Delta f_2$ of frequencies are narrower than $\Delta f_s$, therefore a resonance characteristic with a narrow difference $\Delta f$ of frequencies is realized. This is the principle of the new acoustic wave resonator.

Note that, in this way, in the present embodiment, sometimes bulk wave spurious emission is not handled as a spurious emission. However, for convenience, a bulk wave in which the resonance point or anti-resonance point is utilized will be sometimes referred to as a "bulk wave spurious emission".

(Setting of Various Dimensions)

Below, the influence of various dimensions of the acoustic wave resonator 1 upon the resonance characteristics by the SAW and bulk wave will be shown and the concrete method of setting various dimensions for utilizing the new principle explained above will be explained.

(Electrode Thickness)

The resonance characteristics were found by simulation calculations assuming a plurality of acoustic wave resonators 1 with different thicknesses $t_e$ of the electrode portions 5 (electrode fingers 19).

The conditions of the simulation calculations were as follows: Piezoelectric substrate
  Material: Lithium tantalate single crystal
  Cut angle: 42° Y-plate
  Thickness $t_s$: 7.2 μm
  Support substrate: Silicon
  IDT electrode
  Material: Al—Cu alloy
  Thicknesses $t_e$: Made different in 10 nm increments from 121 to 181 nm
  Pitch "p" of electrode fingers: 0.81207 μm
  Duty ratio of electrode fingers: 0.5
  Note that, the duty ratio is the "electrode finger width/p".
FIG. 4 is a graph showing results of simulation calculations described above.

In this graph, the abscissa indicates the frequency "f" (MHz), and the ordinate indicates the absolute value |Z| (Ω) of impedance. The correspondence between the lines L51 to L57 and the thickness $t_e$ of the electrode are as follows. Note that, numerals in parentheses indicate the values of normalized thickness $t_e/2p$ obtained by normalization of the thicknesses $t_e$ by the pitch "p" of the electrode fingers 19. L51:121 nm (about 0.075), L52:131 nm (about 0.081), L53:141 nm (abut 0.087), L54:151 nm (about 0.093), L55: 161 nm (about 0.099), L56:171 nm (about 0.105), and L57:181 nm (about 0.111).

A region Rr surrounded by a broken line indicates a region in which resonance points of the lines L51 to L57 due to the SAW appear. Further, a region Ra surrounded by a broken line indicates a region in which anti-resonance points of the lines L51 to L57 due to the SAW appear. Regions R1 to R4 indicated by arrows show the regions in which bulk wave spurious emissions appear.

As will be understood from comparison of the lines L51 to L57, if the thickness $t_e$ of the electrode portion 5 is made thick, the resonance frequency and anti-resonance frequency due to the SAW move to a low frequency side. On the other hand, even if the thickness $t_e$ of the electrode portion 5 is made thick, the frequency of the bulk wave spurious emission does not change much at all compared with the resonance frequency and anti-resonance frequency due to the SAW.

Accordingly, by making the thickness $t_e$ of the electrode portion 5 thick or thin, the resonance frequency and anti-resonance frequency due to the bulk wave (bulk wave spurious emission in the region R1 in the example in FIG. 4) can be positioned between the resonance frequency and the anti-resonance frequency due to the SAW. Further, the frequency difference $\Delta f_1$ (FIG. 3) between the resonance frequency of the SAW and the anti-resonance frequency of the bulk wave or the frequency difference $\Delta f_2$ (FIG. 3) between the resonance frequency of the bulk wave and the anti-resonance frequency of the SAW can be adjusted.

Note that, as will be explained later, if the thickness of the piezoelectric substrate 7 changes, the frequency of the bulk wave spurious emission changes. Accordingly, according to a certain thickness of the piezoelectric substrate 7, even if the thickness $t_e$ of the electrode portion 5 is not made thick or thin, the bulk wave spurious emission is positioned between the resonance frequency and the anti-resonance frequency due to the SAW. That is, in realization of the acoustic wave resonator 1 in the present embodiment, adjustment of the thickness $t_e$ is not an essential factor.

Bulk wave spurious emission does not appear only in one frequency domain, but appears in a plurality of frequency domains R1 to R4. The bulk wave spurious emission which is positioned between the resonance frequency and the anti-resonance frequency due to the SAW may be the bulk wave spurious emission of any domain.

In the lines L51 and L52, at a glance, it looks as if no bulk wave spurious emission was generated in the region R1. Further, in the lines L53 to L57, the thicker the thickness $t_e$ of the electrode portion 5, the larger the deflection width of the bulk wave spurious emission in the region R1. This is because the frequency having a high excitation efficiency of bulk wave spurious emission moves to a lower frequency side as the thickness $t_e$ becomes thicker. That is, when the thickness $t_e$ is made thick, not only can the relative relationships between the frequency of the bulk wave spurious emission and the resonance frequency and anti-resonance frequency due to the SAW be changed, but also the amount of deflection of the bulk wave spurious emission can be made larger.

FIG. 4 indicates not only a qualitative influence of the thickness $t_e$ of the electrode portion 5 exerted upon the resonance characteristics as described above, but also an example of the quantitative influence. In the following description, for the lines L51 to L57 in FIG. 4, a table of the anti-resonance frequency $f_{sa}$ due to the SAW (region Ra), anti-resonance frequency $f_{b2a}$ due to the bulk wave in the region R2, and frequency difference between them ($f_{b2a}-f_{sa}$) is shown. Note that, the reason why not the bulk wave spurious emission in the region R1, but the bulk wave spurious emission in the region R2 are used is that a bulk wave spurious emission was not generated in the region R1 for the lines L51 and L52 as explained above.

| $t_e$ (nm) | $f_{sa}$ (MHz) | $f_{b2a}$ (MHz) | $f_{b2a} - f_{sa}$ (MHz) |
|---|---|---|---|
| 121 | 2533.1 | 2573.6 | 40.5 |
| 131 | 2520.7 | 2573.6 | 52.9 |
| 141 | 2506.7 | 2572.1 | 65.4 |
| 151 | 2492.0 | 2572.1 | 80.1 |
| 161 | 2474.9 | 2572.1 | 97.2 |
| 171 | 2455.9 | 2570.5 | 114.7 |
| 181 | 2436.6 | 2570.5 | 133.9 |

As will be understood from a comparison between the case of $t_e$=121 nm ($t_e/2p\approx0.075$) and the case of $t_e$=181 nm ($t_e/2p\approx0.111$), if the thickness $t_e$ is changed by 60 nm (0.036 for $t_e/2p$) (if the thickness is increased by about 50% from $t_e$=121 nm), the resonance frequency and anti-resonance frequency due to the SAW can be changed by 90 MHz or more (when normalized by 2500 MHz, 90/2500×100=3.6% or more) with respect to the frequency of the bulk wave spurious emission. Accordingly, for example, it was confirmed that the adjustment of relative relationships of frequency between the bulk wave and the SAW for realizing the acoustic wave resonator 1 in the present embodiment could be sufficiently realized by adjusting the thickness $t_e$ within a realistic range.

Further, in FIG. 4, the line L51 in which the bulk wave spurious emission R1 seemed to be not positioned between the resonance frequency and the anti-resonance frequency of the SAW since the bulk wave spurious emission R1 is small can be grasped as a resonance characteristic of a conventional SAW resonator. Further, in the line L51, the frequency difference $\Delta f_s$ between the SAW resonance frequency and the SAW anti-resonance frequency is about 100 MHz. On the other hand, for example, in the line L57, the frequency difference $\Delta f_1$ between the bulk wave resonance frequency and the SAW anti-resonance frequency is about 30 MHz. Accordingly, in the example in FIG. 4, by increasing the thickness $t_e$ of the electrode portion 5 by just 50% relative to the conventional SAW resonator, the difference $\Delta f$ of frequencies can be made narrower up to 30% compared with the conventional resonator, therefore a remarkable effect is exerted.

In order to realize the acoustic wave resonator 1 in the present embodiment, the thickness $t_e$ of the electrode portion 5 may be made thicker or thinner compared with the thickness $t_e$ of the electrode portion 5 in the usual SAW resonator. For example, the electrode portion 5 in the acoustic wave resonator 1 may be made thicker compared with the electrode portion 5 in the usual SAW resonator. In this case, for example, it is easy to utilize a bulk wave spurious emission having a relatively low frequency while employing the material and cut angle etc. of the piezoelectric substrate 7 which are being actually utilized or are easily utilized. The effect by utilizing the bulk wave spurious emission having a relatively low frequency will be explained later.

In a usual SAW resonator, the thickness $t_e$ of the electrode portion 5 (electrode fingers 19) is set so that the excitation efficiency of the SAW becomes the highest. In general, the normalized thickness $t_e/2p$ obtained by normalizing the thickness $t_e$ by the pitch "p" of the electrode fingers 19 is about 0.070. Accordingly, for example, if the normalized thickness $t_e/2p$ is 0.075 or more, there is a possibility that a bulk wave is considered. Further, if the normalized thickness $t_e/2p$ exceeds 0.080, this means that the thickness has become thicker by about 15% from the normalized thickness $t_e/2p$ (0.07) of the usual SAW resonator and easily exceeds the error range, so it can be almost certainly said that a bulk wave is considered.

Further, if the thickness $t_e$ of the electrode portion 5 becomes 0.06 or less or 0.09 or more in terms of the normalized thickness, the loss becomes large, so this thickness is not employed in a usual design. In this way, even in a case where the thickness is too thick or too thin, it can be said that a bulk wave is considered.

Note that, in a usual SAW resonator, the thickness of the electrode fingers 19 designates the thickness in the vicinity of the center of the intersection areas of the electrode fingers 19.

(Electrode Finger Pitch)

Although particularly not shown, if the pitch "p" of the electrode fingers 19 is changed, the frequencies of both of the standing wave of the SAW and the standing wave of the bulk wave (bulk wave spurious emission) change. That is, if the pitch "p" is made small, the frequencies of the standing wave of the SAW and the standing wave of the bulk wave become higher and consequently the resonance frequencies and anti-resonance frequencies due to the SAW and bulk wave become higher. This is obvious from the principle of excitation of the standing wave by the IDT electrode 11.

Accordingly, if the thickness $t_e$ of the electrode fingers 19 (electrode portion 5) is set so as to obtain the desired frequency difference $\Delta f_1$ or $\Delta f_2$, and the pitch "p" is suitably set, the desired combination of the frequency difference $\Delta f_1$ and the SAW resonance frequency $f_{sr}$ and bulk wave anti-resonance frequency $f_{ba}$ or the desired combination of the frequency difference $\Delta f_2$ and the bulk wave resonance frequency $f_{br}$ and SAW anti-resonance frequency $f_{sa}$ is realized.

Specifically, for example, a suitable value is assumed first as the pitch "p". For example, the pitch "p" is set in the same way as the case where the SAW resonance frequency $f_{sr}$ or SAW anti-resonance frequency $f_{sa}$ which is to be obtained in the acoustic wave resonator 1 is obtained in the usual SAW resonator. Next, under such an assumption, the thickness $t_e$ of the electrode fingers 19 enabling the desired frequency difference $\Delta f_1$ or $\Delta f_2$ to be obtained is calculated. Next, at that calculated thickness $t_e$, the pitch "p" capable of obtaining the desired SAW resonance frequency $f_{sr}$ and bulk wave anti-resonance frequency $f_{ba}$ or the desired bulk wave resonance frequency $f_{br}$ and SAW anti-resonance frequency $f_{sa}$ is calculated. Even if the pitch "p" is changed from the value which was assumed first, the frequencies of both of the SAW and bulk wave change together, therefore the desired $f_{sr}$ and $f_{ba}$ or desired $f_{br}$ and $f_{sa}$ are realized while maintaining the desired frequency difference $\Delta f_1$ or $\Delta f_2$.

In the setting operation as described above, when the thickness $t_e$ of the electrode fingers 19 is made thicker, the resonance frequency and anti-resonance frequency of the SAW move to a low frequency side, therefore the pitch "p" of the electrode fingers 19 is made narrower so that these frequencies become higher. Conversely, when the thickness $t_e$ of the electrode fingers 19 is made thinner, the resonance frequency and anti-resonance frequency of the SAW move to a high frequency side, therefore the pitch "p" of the electrode fingers 19 is made wider so that these frequencies become lower.

Note, as already explained, in the case where the acoustic wave resonator 1 in the present embodiment is realized by the thickness $t_e$ of the electrode fingers 19 being made thicker than the thickness $t_e$ in the usual SAW resonator, it is easy to utilize a bulk wave spurious emission having a relatively low frequency while employing as the material and cut angle etc. of the piezoelectric substrate 7 ones which are being actually utilized or are easily utilized. Accordingly, it is considered that the pitch "p" of the electrode fingers 19 becomes narrower in the acoustic wave resonator 1 compared with the pitch "p" in the usual SAW resonator in many cases.

Here, the pitch "p" in the usual SAW resonator basically has become a half ($\lambda_0/2$) of a wavelength $\lambda_0=V/f_{sr}$ which is found from the propagation velocity V of the SAW and the resonance frequency $f_{sr}$. Accordingly, in the acoustic wave resonator 1 (finished product) having a frequency adjusted by narrowing the pitch "p", when the propagation velocity V is specified based on the material and cut angle of the piezoelectric substrate 7 (may be measured as well), an actual resonance frequency $f_r$ ($f_{sr}$ or $f_{br}$ ($>f_{sr}$)) is measured, and $\lambda_0=V/f_r$ is calculated, "p" becomes smaller than $\lambda_0/2$. Note that, when referring to "the pitch "p" is smaller than the half wavelength $\lambda_0/2$", a case where such a state occurs due to manufacturing error is excluded. The manufacturing error of the pitch "p" is for example 50 nm.

As explained above, depending on the thickness etc. of the piezoelectric substrate 7 explained later, even if the thickness $t_e$ of the electrode fingers 19 is not adjusted, sometimes the desired frequency difference $\Delta f_1$ or $\Delta f_2$ is obtained. In this case, for example, adjustment of only the pitch "p" of the electrode fingers 19 is sufficient. Further, for example, as a result of suitably setting the initial value of the pitch "p", it is conceivable that the anti-resonance frequency or resonance frequency due to the bulk wave will substantially match with the bulk wave anti-resonance frequency $f_{ba}$ or bulk wave resonance frequency $f_{br}$ trying to be obtained. In this case, adjustment of only the thickness $t_e$ of the electrode fingers 19 is sufficient. Naturally, sometimes adjustment of neither the thickness $t_e$ nor pitch "p" is necessary.

(Qualitative Influence of Thickness of Piezoelectric Substrate)

The present inventors engaged in repeated intense studies and consequently guessed that bulk wave spurious emissions having various frequencies are generated by the following mechanism:

When applying voltage to the piezoelectric substrate by the IDT electrode 11, a plurality of types of bulk waves differing from each other in at least one of the mode of vibration direction and mode of order are generated. The modes of vibration direction are for example the mode of vibration in the D3 axis direction, the mode of vibration in the D2-axis direction, and the mode of vibration in the D1-axis direction. Each of the modes of vibration direction includes a plurality of modes of order. The modes of order are defined according to for example numbers of nodes and antinodes in the depth direction (D3 axis direction).

Therefore, assuming a plurality of SAW resonators 1 given thicknesses $t_s$ of piezoelectric substrate 7 made different from each other (unlike the acoustic wave resonator 1 in the present embodiment, ones without adjustment of the thickness $t_e$ and pitch "p" of the electrode fingers 19), the influences of thicknesses of the piezoelectric substrates 7 exerted upon the frequency of the bulk wave of each mode were checked. Specifically, by simulation calculations, the frequencies of bulk waves of the different modes generated on the piezoelectric substrates 7 having various thicknesses were calculated.

Figure 5A:
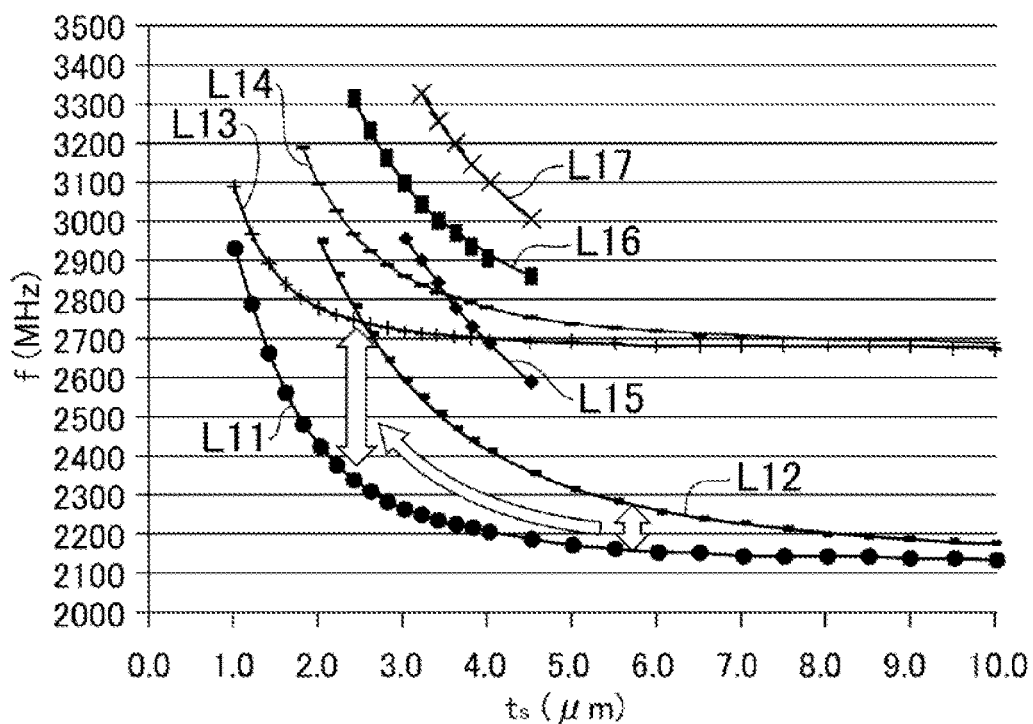
FIG. 5A is a graph showing an influence of a thickness of a piezoelectric substrate exerted upon a frequency of a bulk wave spurious emission.

FIG. 5A is a graph showing the results of simulation calculations as described above.

In this graph, the abscissa ($t_s$) shows the thicknesses of the piezoelectric substrates 7. The ordinate (f) shows the frequencies of the bulk waves (appearing as the bulk wave resonance frequencies $f_{br}$ in the acoustic wave resonators 1). The plurality of lines L11 to L17 show the frequencies of a plurality of types of bulk waves between which at least one of the modes of vibration direction and modes of order differ from each other.

Note that, in this graph, the plots of the lines L15, L16, and L17 were shown up to the middle. In actuality, however, the lines continue to drop in frequencies along with an increase of thicknesses in the same way as the lines L11 to L14. Further, although not shown, even after the line L17 (line L18, line L19, . . . ), there are numerous lines exhibiting the same trends as those of L11 to L17. Further, in a usual bonded substrate, 20 μm is recommended in many cases as the thickness of the piezoelectric substrate 7. That is, the thickness of the usual bonded substrate is further greater than the thicknesses in the thickness range shown in FIG. 5A.

As shown in this graph, in any mode of bulk wave, the thinner the thickness of the piezoelectric substrate 7, the higher the frequency.

The line L11 and the line L12 indicate the frequencies of the bulk waves between which the modes of vibration direction are the same as each other and the modes of order are different from each other. As indicated by the arrows, the thinner the thickness of piezoelectric substrate 7, the larger the frequency interval of these two bulk waves. Note that, this is true also for the other bulk waves between which the modes of vibration direction are the same as each other and the modes of order are different from each other (for example lines L13 and L14).

Figure 5B:
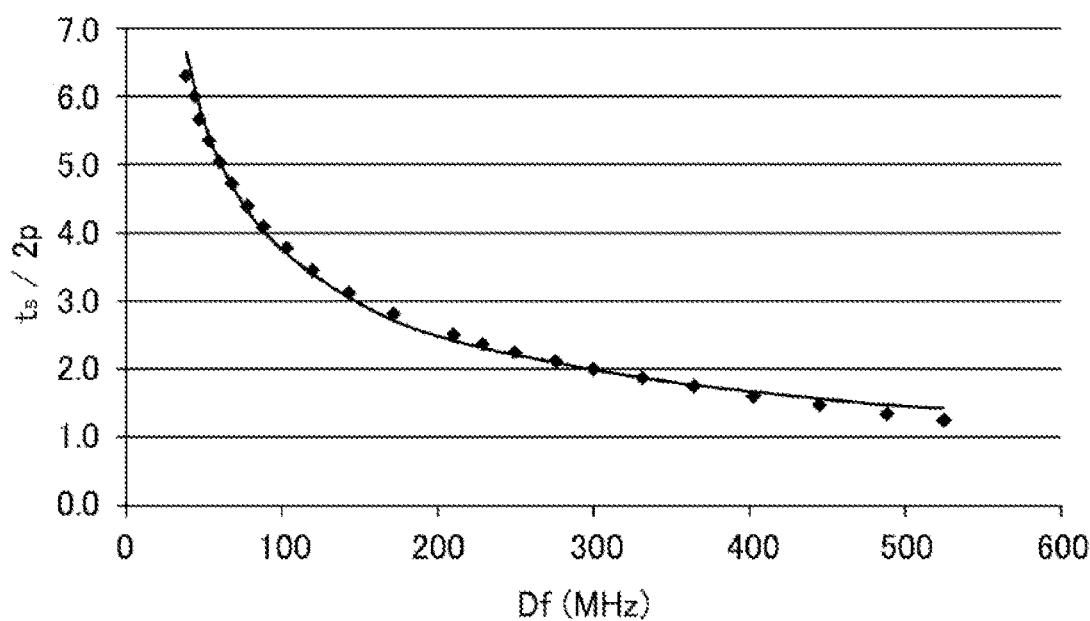
FIG. 5B is a graph showing an influence of a thickness of a piezoelectric substrate exerted upon a frequency interval of a bulk wave spurious emission.

FIG. 5B is a graph showing the relationships between the thickness of the piezoelectric substrate 7 and the frequency interval of the bulk waves of the same mode of vibration direction, but which are different in the mode of order as described above. This graph is obtained from the results of simulation calculations.

The abscissa Df indicates the frequency interval. The ordinate $t_s/2p$ indicates the normalized thickness of the piezoelectric substrate 7. The normalized thickness $t_s/2p$ is obtained by dividing the thickness $t_s$ of the piezoelectric substrate 7 by two times the pitch "p" of the electrode fingers 19 (here, basically the same as the wavelength λ of the SAW) and is a dimensionless quantity (there is no unit). In this graph, each plot indicates the frequency interval of the bulk waves obtained by the simulation calculation, and the line indicates an approximation curve.

As shown in this graph, the frequency interval of the bulk waves where the normalized thickness of the piezoelectric substrate 7 is made thin increases abruptly more as the normalized thickness of the piezoelectric substrate 7 is thinner. For example, when the normalized thickness $t_s/2p$ is 5 or more, the frequency interval does not change so much. On the other hand, when the normalized thickness $t_s/2p$ becomes 3 or less, the frequency interval suddenly increases. Note that, the inclination of the curve approaches a constant level if the normalized thickness $t_s/2p$ becomes 3 or less.

Accordingly, for example, if the thickness $t_s$ of the piezoelectric substrate (normalized thickness $t_s/2p$) is made relatively thin, the frequency interval between the bulk wave spurious emissions becomes wide. Therefore, in the frequency domain between the SAW resonance frequency $f_{sr}$ and the SAW anti-resonance frequency $f_{sa}$ and on the periphery, only the frequency of the bulk wave spurious emission which is to be utilized for making $\Delta f$ narrow is positioned, and the other bulk wave spurious emissions which truly become spurious emissions can be kept away from the frequency domain described before.

Further, for example, if the thickness $t_s$ (normalized thickness $t_s/2p$) is made relatively thin, the frequency between the bulk wave spurious emissions becomes high. As a result, for example, among numerous bulk wave spurious emissions, the bulk wave spurious emission having the lowest frequency (line L11) becomes easy to approach the resonance frequency and anti-resonance frequency which are to be realized in the acoustic wave resonator 1. Due to this, as the bulk wave spurious emission which is utilized for making $\Delta f$ narrow, it becomes easy to select the bulk wave spurious emission having the lowest frequency. The effect by this will be explained later.

(Quantitative Influence of Thickness of Piezoelectric Substrate)

Figure 6:
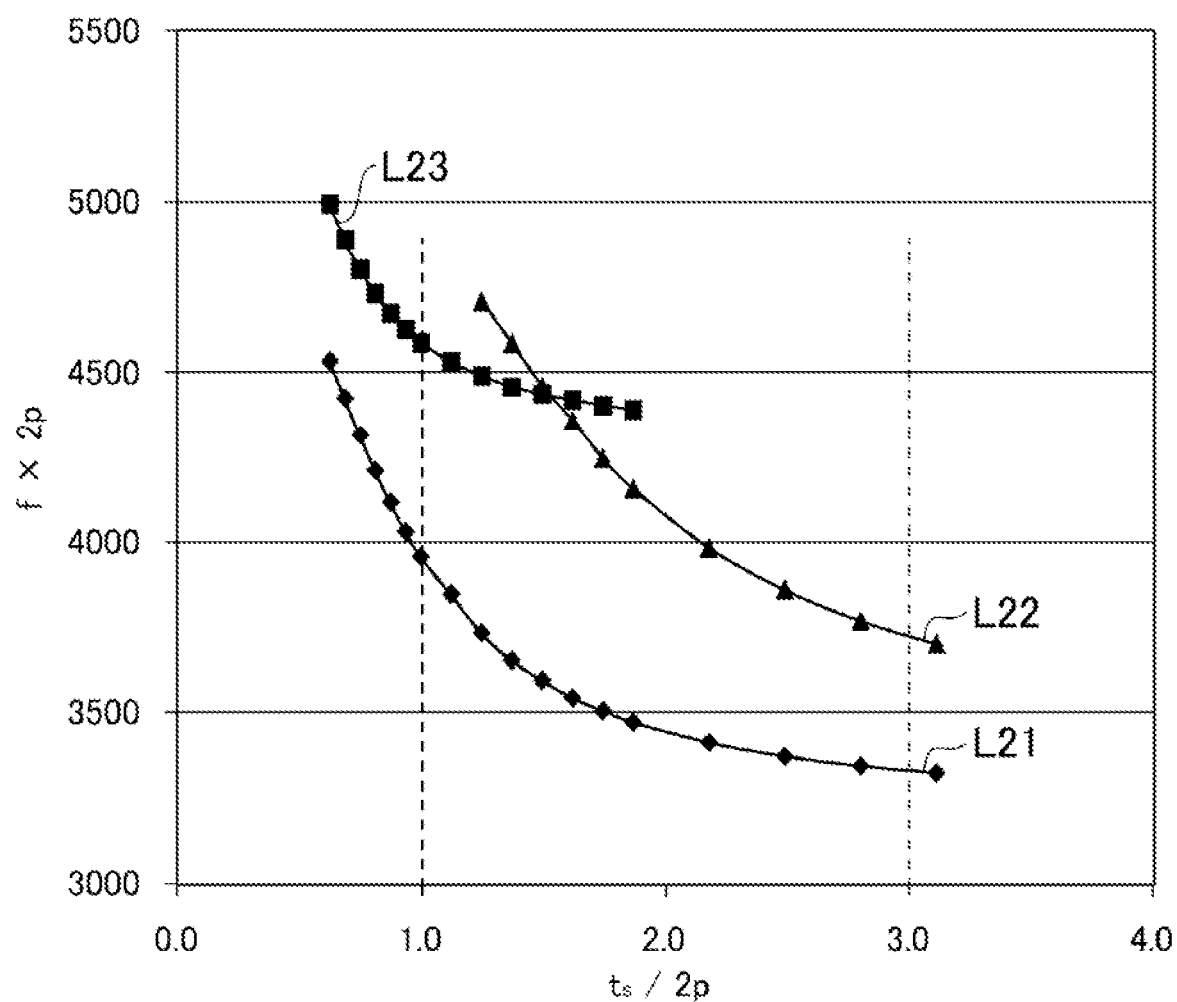
FIG. 6 A graph for explaining a bulk wave spurious emission utilized in the acoustic wave resonator in FIG. 1.

Referring to FIG. 6, the influence of the thickness of the piezoelectric substrate 7 will be quantitatively evaluated and an example of the range of the thickness of the piezoelectric substrate 7 will be explained.

FIG. 6 is a graph showing the relationships between the thickness of the piezoelectric substrate 7 and the frequency of the bulk wave as in FIG. 5A and shows the frequencies of three bulk waves on a side where the frequency is low within a range where the thickness of the piezoelectric substrate 7 is relatively thin.

FIG. 6 is obtained based on the simulation calculations. The conditions of simulation will be shown below:
Piezoelectric substrate:
Material: Lithium tantalate single crystal
Cut angle: 42°-rotated Y-plate
Support substrate: Silicon
IDT electrode:
Material: Al—Cu alloy
Thickness $t_e$: 121 nm
Pitch "p" of electrode fingers: 0.80413 μm
Duty ratio of electrode fingers: 0.5
Note that, the duty ratio is "electrode finger width/p".

In FIG. 6, the abscissa indicates the normalized thickness $t_s/2p$, while the ordinate indicates the normalized frequency f×2p. The normalized frequency f×2p is the product of the frequency "f" and two times the pitch "p" of the electrode fingers 19 (here, basically the same as the wavelength λ of the SAW).

The line L21 indicates a bulk wave having the lowest frequency in a shown range (the range where $t_s/2p$ is 1 to 3 and the periphery of the same). This bulk wave will be called "the bulk wave of the first type in the order mode of the first vibration direction mode". Note that, the vibration direction of the first vibration direction mode is a bulk wave which vibrates substantially in the D3-axis direction in the lithium tantalate. Note that, this line L21 is generated on the lowest frequency side among the bulk waves which may be generated.

The line L22 indicates a bulk wave having the next lowest order (frequency from another viewpoint) relative to the bulk wave of the line L21 among the bulk waves having the same vibration direction mode as that of the bulk wave of the line L21. This bulk wave will be called "the bulk wave of the second type in the order mode of the first vibration direction mode".

The line L23 is a bulk wave having the lowest frequency in the shown range among the bulk waves which are different in the vibration direction mode from that of the bulk waves of lines L21 and L22. This will be called "the bulk wave of the first type in the order mode of the second vibration direction mode". The line L23 is higher in frequency than the line L21, but crosses the line L22 and is lower in frequency than the line L22 in a range where the normalized thickness $t_s/2p$ is thinner than the intersection. Note that, the vibration direction of the second vibration direction mode is the bulk wave which vibrates substantially in the D2-axis direction in the lithium tantalate.

The lines L21 to L23 correspond to the lines L11 to L13 in FIG. 5A. As understood from the explanation for the lines L21 to L23 explained above and comparison between FIG. 6 and FIG. 5A, in the shown range, there is no bulk wave drawing a line positioned under the line L21 (the frequency is lower). Further, in the shown range, there is no bulk wave drawing a line positioned between the line L21 and the line L22 or L23 either. In other words, the other bulk waves, in the shown range, are positioned above the lines L22 and L23 (frequencies are higher).

Accordingly, so far as the SAW resonance frequency $f_{sr}$ is positioned on a lower frequency side than the line L21 and the SAW anti-resonance frequency $f_{sa}$ is kept in a region surrounded by the lines L21 to L23, the bulk wave spurious emission of the line L21 can be utilized for making the difference $\Delta f$ of frequencies narrow. In the acoustic wave resonator 1, the thickness $t_s$ (normalized thickness $t_s/2p$) of the piezoelectric substrate 7 may be set so that such relationships of frequencies are obtained.

When looking at an acoustic wave resonator as one prepared product, this product has only one value as the normalized thickness $t_s/2p$, therefore the SAW anti-resonance frequency $f_{sa}$ is kept between the frequency of the bulk wave spurious emission having the lowest frequency and the bulk wave frequency having the next lowest frequency. Further, the bulk wave frequency having the next lowest frequency described above is one of the line L22 or one of the line L23 (one by the two at the intersection point).

The region on a lower frequency side than the line L21 or the region surrounded by the lines L21 to L23 is a region in which another bulk wave is not generated as explained above. Such a region is a unique region which becomes extremely broad even compared with the other regions which are surrounded by a variety of lines in any combination. This can realize the advantage in the ordinate direction in the graph that no bulk wave spurious emission at all is generated in a certain frequency range (for example the range on the periphery of the SAW resonance frequency $f_{sr}$ or SAW anti-resonance frequency $f_{sa}$) and also the advantage in the abscissa direction in the graph that no bulk wave spurious emission is generated even if the thickness of the piezoelectric substrate 7 varies a little.

The normalized thickness $t_s/2p$ may be for example 1 to 3. In this case, for example, the bulk wave spurious emission having the lowest frequency as described above (line L21) can be utilized.

If $t_s/2p$ is less than 1, for example, the loss of the SAW becomes large. Further, for example, the frequency of the SAW becomes susceptible to the influence of the state of the bottom surface of the piezoelectric substrate 7, and the variation of frequency characteristics becomes large among a plurality of acoustic wave resonators 1. Further, for example, it becomes difficult to secure the strength of the piezoelectric substrate 7. Conversely speaking, if $t_s/2p$ is 1 or more, such an inconvenience is solved or reduced.

Further, if $t_s/2p$ is 3 or less, for example, as already alluded to, the frequency interval between the bulk waves which are different in mode from each other is relatively wide. Further, for example, when considering an actual propagation speed of the SAW and so on, the frequency of the bulk wave spurious emission having the lowest frequency is easily positioned between the SAW resonance frequency $f_{sr}$ and the SAW anti-resonance frequency $f_{sa}$.

Note that, the normalized thickness $t_s/2p$ being 1 to 3 is just one example of the range. Within a range where the normalized thickness $t_s/2p$ is less than 1 or exceeding 3, the frequency of the bulk wave spurious emission having the lowest frequency may be positioned between the SAW resonance frequency $f_{sr}$ and the SAW anti-resonance frequency $f_{sa}$ as well.

Two times the pitch "p" (2p) in the acoustic wave resonator 1 is for example 1.5 μm to 6 μm. Accordingly, $t_s$ is for example 1.5 μm to 18 μm. Targeting other effects accompanied with reducing the thickness of the piezoelectric substrate 7 (for example increase of temperature compensation effect of the support substrate 9) and so on, $t_s$ may be made further thinner than that in the range described above and set to 1.5 μm to less than m as well.

(Support Substrate)

In the example explained above, the case of using the Si substrate as the support substrate 9 was explained as an example. However, it is confirmed that the same applies to the case of using a sapphire substrate. Specifically, when expressing the lines L21 to L23 shown in FIG. 6 by equations, although the coefficients determining inclination etc. are different, the same trend is shown. Specifically, where the normalized thickness is "x" and the normalized frequency is "y", the approximate equations of the lines L21 to L23 become as follows in the case where use is made of an Si substrate as the support substrate:

$L21: y = 71.865x^4 - 706.82x^3 + 2641.5x^2 - 4567.1x + 6518.1$ $L22: y = 466.89x^4 - 2884x^3 + 6768x^2 - 7310.5x + 7544.4$ $L23: y = -66.245x^3 + 689.86x^2 - 2546x + 6941.6$

In the same way, when use is made of a sapphire substrate, the approximate equations of the lines L21 to L23 become as follows:

$L21: y = 33.795x^4 - 419.77x^3 + 1966.9x^2 - 4212.8x + 6990.5$ $L22: y = -54.624x^3 + 625.48x^2 - 2533.6x + 7334.6$ $L23: y = -258.23x^3 + 1477.7x^2 - 2912.2x + 6418.1$ (Combination of Electrode Thickness and Electrode Finger Pitch)

As already explained, for example, the thicker the thickness $t_e$ of the electrode portion 5, the lower the SAW resonance frequency $f_{sr}$ and SAW anti-resonance frequency $f_{sa}$. Further, this drop in the frequency can be compensated for by narrowing the pitch "p" of the electrode fingers 19. At this time, the higher the order mode of bulk wave, the higher frequency. As a result, for example, utilization of the bulk wave spurious emission is facilitated more. This will be shown below.

Figure 7:
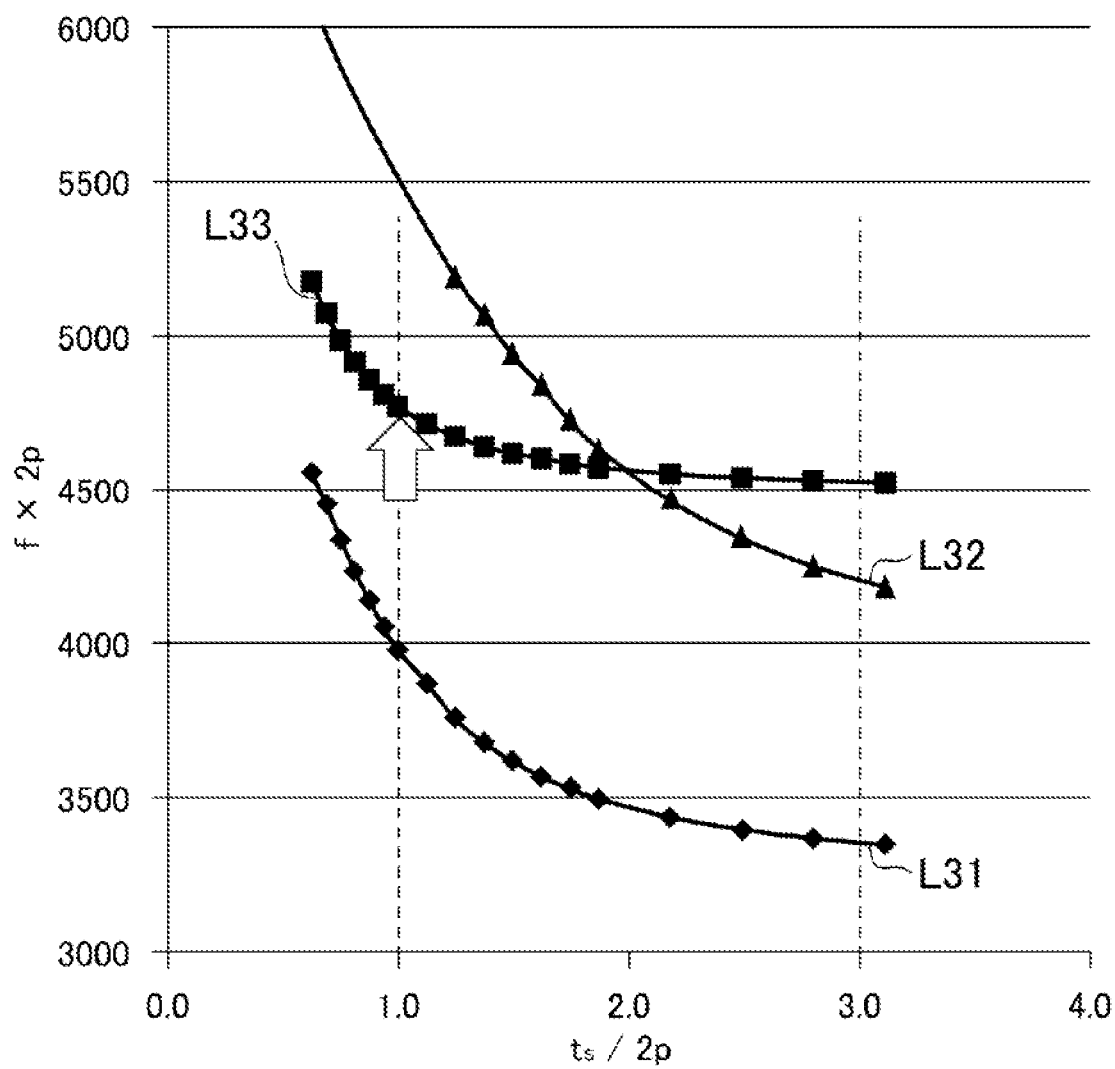
FIG. 7 A graph showing an influence of a thickness of an IDT electrode and a change of pitch exerted upon the bulk wave spurious emission in FIG. 6.

FIG. 7 is a graph corresponding to FIG. 6 in a case where the thickness $t_e$ of the IDT electrode 11 is made thicker than that in FIG. 6.

FIG. 7 is obtained based on the simulation calculations in the same way as FIG. 6. The simulation conditions different from those in FIG. 6 will be shown below:

IDT electrode

Thickness $t_e$: 201 nm

Pitch "p" of electrode fingers: 0.75768 μm

The lines L31 to L33 correspond to the lines L21 to L23. That is, the lines L31 to L33 correspond to the first type in the order mode of the first vibration direction mode, the second type in the order mode of the first vibration direction mode, and the first type in the order mode of the second vibration direction mode. Note that, the abscissa in the graph is made the same as that in FIG. 6. That is, this indicates values before adjustment of the thickness and pitch of the IDT electrode 11. Further, the line L31 indicates the simulation results in the case of the same thickness as that in FIG. 6, while the line L32 and line L33 indicate the simulation results in the case where the thicknesses are determined as explained above.

In FIG. 7, compared with FIG. 6, the frequencies of the lines L32 and L33 (particularly the line L32) become high, and consequently the width of the frequency in the region surrounded by the lines L31 to L33 becomes broad. Due to this, when it is desired to position the SAW resonance frequency $f_{sr}$ and the SAW anti-resonance frequency $f_{sa}$ on a higher frequency side than that in FIG. 6 and/or when the frequency of the bulk wave is to be positioned on a higher frequency side than that in FIG. 6, there is reduced apprehension that the bulk wave spurious emissions by the lines L32 and L33 which truly become spurious emissions appear in the frequency domain on the periphery of the same.

In this way, the results in FIG. 7 show that the specific range surrounded by the lines L21 to L23 in FIG. 6 can be offset to the desired position by adjusting the thickness and pitch of the IDT electrode 11. That is, the specific region can be shifted to a high frequency side or can be offset to a low frequency side. Further, it is possible to adjust the thickness range of the piezoelectric substrate 7 capable of utilizing the bulk wave spurious emission having the lowest frequency to a practical region or possible to widen the thickness range.

(Method of Design)

Figure 8:
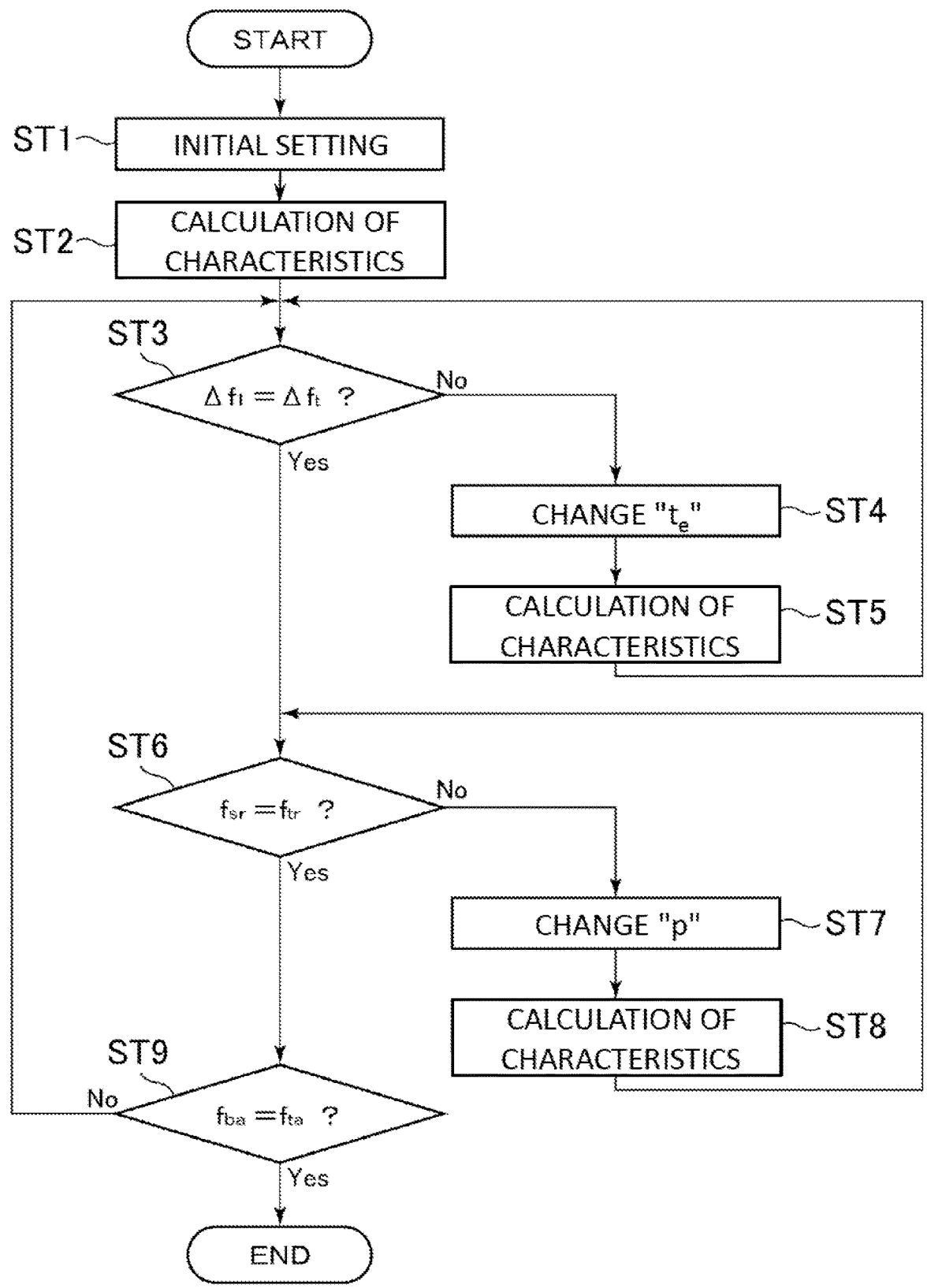
FIG. 8 A flow chart showing an example of a procedure of a method of designing the acoustic wave resonator in FIG. 1.

FIG. 8 is a flow chart showing an example of the procedure of design of the thickness $t_e$ of the electrode portion 5 and pitch "p" of the electrode fingers 19 etc.

This procedure is shown further detailing the procedure of the method of design explained above. As explained with reference to FIG. 3B, the acoustic wave resonator 1 includes the aspect of utilizing the SAW resonance frequency $f_{sr}$ and the bulk wave anti-resonance frequency $f_{ba}$ (frequency difference $\Delta f_1$) and the aspect of utilizing the bulk wave resonance frequency $f_{br}$ and the SAW anti-resonance frequency $f_{sa}$ (frequency difference $\Delta f_2$). An explanation will be given taking the former as an example.

At step S1, the various design conditions or design values of the acoustic wave resonator 1 are initially set. For example, the material, cut angle, and thickness $t_s$ of the piezoelectric substrate 7 and the material, thickness $t_e$, crossing width, pitch "p", duty ratio, and number of the electrode fingers 19 and so on are suitably selected. At this time, provisional values are set also for the thickness $t_e$ and the pitch "p" which are changed after step ST1. Further, for example, as already explained, the values may be initially set in the same way as the case where the SAW resonance frequency $f_{sr}$ or SAW anti-resonance frequency $f_{sa}$ (SAW resonance frequency $f_{sr}$ in the procedure in FIG. 8) which is to be obtained in the acoustic wave resonator 1 is obtained in a usual SAW resonator.

At step S2, the resonance characteristics are calculated based on the designing conditions or design values set at step ST1. Specifically, for example, simulation calculation is carried out, and the SAW resonance frequency $f_{sr}$ and bulk wave anti-resonance frequency $f_{ba}$, and the difference $\Delta f_1$ of frequency between them are calculated.

At step S3, it is judged whether the frequency difference $\Delta f_1$ calculated at step ST2 coincides with the targeted frequency difference $\Delta f_t$. Note that, the judgment of whether they coincide referred to here includes judgment of whether the difference of the two is kept in a predetermined permissible range. This same is also true for steps ST6 and ST9 which will be explained later. Further, when judging that they do not coincide, the routine proceeds to step ST4. Otherwise, when judging that they coincide, the routine skips steps ST4 and ST5 and proceeds to step ST6.

At step S4, the design value of the thickness $t_e$ of the electrode portion 5 is changed so that the calculated frequency difference $\Delta f_1$ approaches the targeted frequency difference $\Delta f_t$. That is, if $\Delta f_1$ ($=f_{ba}-f_{sr}$)<$\Delta f$ (including also $\Delta f_1 \leq 0$), the design value of the thickness $t_e$ is made thick so that the SAW resonance frequency $f_{sr}$ moves to a low frequency side. Conversely, if $\Delta f_1 > \Delta f_t$, the design value of the thickness $t_e$ is made thin so that the SAW resonance frequency $f_{sr}$ moves to a high frequency side. The amount of change at this time may be suitably set. Further, it may be a constant amount or may be adjusted in accordance with the magnitude of the difference between $\Delta f_1$ and $\Delta f_t$.

At step S5, the same calculation as that at step ST2 is carried out. Further, the routine returns to step ST3. Due to this, the design value of the thickness $t_e$ is changed until the positive judgment is carried out at step ST3.

At step S6, it is judged whether the SAW resonance frequency $f_{sr}$ coincides with the target resonance frequency $f_{tr}$. Further, when judging it does not coincide, the routine proceeds to step ST7. When judging it coincides, the routine skips steps ST7 and ST8 and proceeds to step ST9.

At step S7, the design value of the pitch "p" of the electrode fingers 19 is changed so that the SAW resonance frequency $f_{sr}$ approaches the target resonance frequency $f_{tr}$. That is, if $f_{sr} < f_{tr}$, the design value of the pitch "p" is made narrow so that the SAW resonance frequency $f_{sr}$ moves to the high frequency side. Conversely, if $f_{sr} > f_{tr}$, the design value of the pitch "p" is made wide so that the SAW resonance frequency $f_{sr}$ moves to the low frequency side. The amount of change at this time may be suitably set. Further, it may be a constant amount or may be adjusted in accordance with the magnitude of difference between $f_{sr}$ and $f_{tr}$.

At step S8, the same calculation as that at step ST2 is carried out. Further, the routine returns to step ST6. Due to this, the design value of the pitch "p" is changed until the judgment at step ST6 is yes.

At step S9, it is judged whether the bulk wave anti-resonance frequency $f_{ba}$ coincides with the target anti-resonance frequency $f_{ta}$. Basically, when the SAW resonance frequency $f_{sr}$ coincides with the target value at step ST6 after the frequency difference $\Delta f_1$ coincides with the target value at step ST3, the bulk wave anti-resonance frequency $f_{ba}$ ($=f_{sr}+\Delta f_1$) also coincides with the target anti-resonance frequency $f_{ta}$. However, the pitch "p" affects the difference $\Delta f_1$ somewhat, therefore such a judgment is carried out for confirmation.

Further, when judging noncoincidence at step ST9, the routine returns to step ST3. Due to this, step ST3 and the following steps are repeated until both of the frequency difference $\Delta f_1$ and the SAW resonance frequency $f_{sr}$ (consequently the bulk wave anti-resonance frequency $f_{ba}$) coincide with the target values. Further, when judging coincidence, the design procedure is completed.

Note that, in place of step ST9, the same judgment as that at step ST3 may be carried out as well. Further, the judgment at step ST6 and the judgment at step ST9 can be reversed. That is, the step of making the SAW resonance frequency $f_{sr}$ coincide with the target value and the step of making the bulk wave anti-resonance frequency $f_{ba}$ coincide with the target value may be grasped as the same step as well. In the same way, when the difference $\Delta f_2$ of frequencies is utilized, the step of making the SAW anti-resonance frequency $f_{sa}$ coincide with the target value and the step of making the bulk wave resonance frequency $f_{br}$ coincide with the target value may be grasped as the same step.

Example of Utilization of Acoustic Wave Resonator

Below, as examples of utilization of the acoustic wave resonator 1, an acoustic wave filter, multiplexer, and communication apparatus will be explained.

(Acoustic Wave Filter)

Figure 9A:
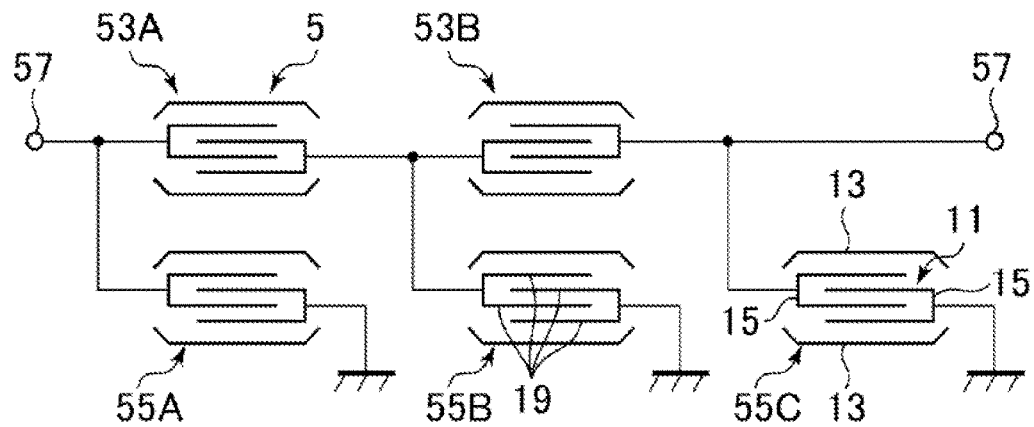
FIG. 9A to FIG. 9C are schematic views showing a ladder type filter as an example of utilization of the acoustic wave resonator in FIG. 1.

FIG. 9A schematically shows an acoustic wave filter 51 including the acoustic wave resonator 1. The acoustic wave filter 51 is a so-called ladder type resonator filter and has one or more (two in FIG. 9A) serial resonators 53A and 53B and one or more (three in FIG. 9A) parallel resonators 55A to 55C which are connected in a ladder configuration. Note that, in the following description, "A", "B", or "C" of these notations will be sometimes omitted.

Each of the serial resonators 53 and parallel resonators 55 is for example a 1-port resonator including an IDT electrode 11 and reflectors 13 on the two sides thereof. The IDT electrodes 11 and pairs of reflectors 13 (electrode portions 5) in these plurality of resonators are for example provided on a common piezoelectric substrate 7.

One or more serial resonators 53 are for example connected in series between a pair of terminals 57 (may be lines in place of the terminals as well). That is, one of the pair of comb-shaped electrodes 15 is directly or indirectly connected to one of the pair of terminals 57, and the other of the pair of comb-shaped electrodes 15 is directly or indirectly connected to the other of the pair of terminals 57.

One or more parallel resonators 55 are for example connected between a part between a pair of terminals 57 (from another viewpoint, before or after any one serial resonator 53) and the reference potential portion. That is, one of the pair of comb-shaped electrodes 15 is connected to the part between the pair of terminals 57, and the other of the pair of comb-shaped electrodes 15 is connected to the reference potential portion.

The serial resonators 53 and parallel resonators 55 are configured so that the anti-resonance frequency of the parallel resonator 55 and the resonance frequency of the serial resonator 53 coincide. Due to this, between the pair of terminals 57, a filter having the anti-resonance frequency of the parallel resonator 55 and the resonance frequency of the serial resonator 53 as the center of the passing band is configured.

Further, at least one among the one or more serial resonators 53 and one or more parallel resonators 55 is configured by the acoustic wave resonator 1 in the present embodiment.

Figure 9B:
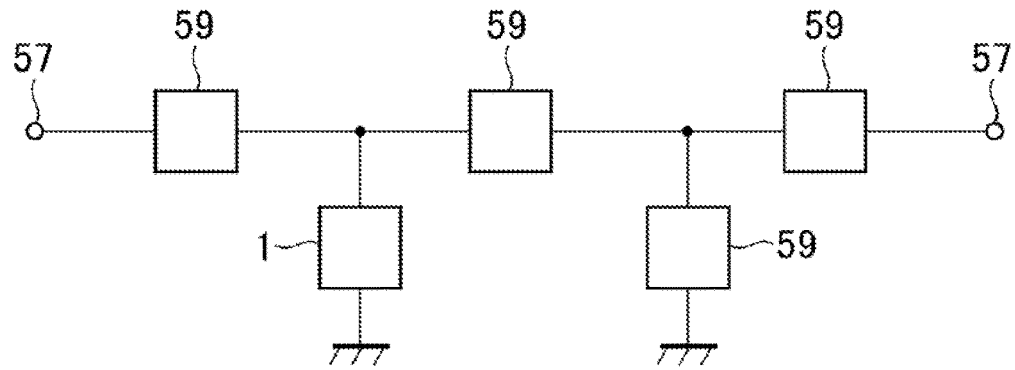

For example, as shown in FIG. 9B which further schematically shows FIG. 9A, one of the parallel resonators 55 may be configured by the acoustic wave resonator 1 in the present embodiment while the serial resonators 53 and the other parallel resonator 55 may be configured by conventional SAW resonators 59. If the acoustic wave resonator 1 in the present embodiment is used for the parallel resonator 55 in this way, the difference $\Delta f$ of frequencies can be made narrow, therefore the rise of the amount of attenuation on the low frequency side in the passing band can be made steep, so the filter characteristics of the acoustic wave filter 51 are improved. In particular, it is preferable to use the acoustic wave resonator 1 in the present embodiment for the parallel resonator 55 having the highest resonance frequency among the plurality of parallel resonators 55.

Figure 9C:
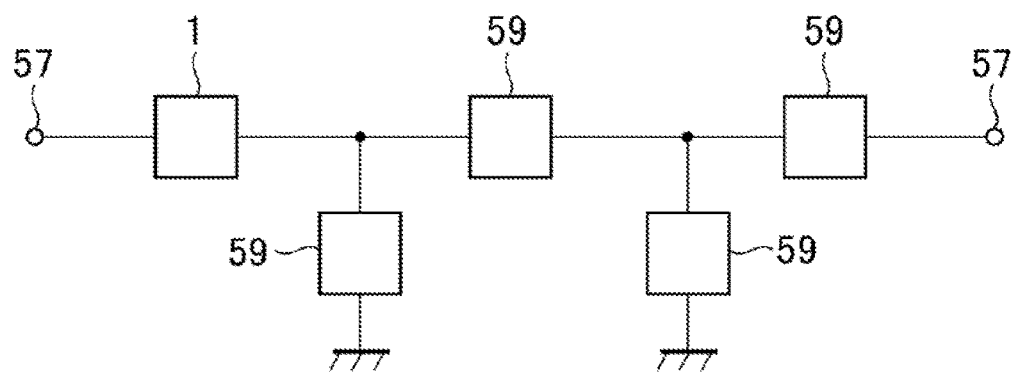

Further, for example, as shown in FIG. 9C, which is a schematic view of an example different from that in FIG. 9B, one of the serial resonators 53 may be configured by the acoustic wave resonator 1 in the present embodiment, while the other serial resonators 53 and the parallel resonators 55 may be configured by conventional SAW resonators 59. If the acoustic wave resonator 1 in the present embodiment is used for a serial resonator 53 in this way, the difference $\Delta f$ of frequencies can be made narrow, therefore the fall of the amount of attenuation on the high frequency side in the passing band can be made steep, so the filter characteristics of the acoustic wave filter 51 are improved. In particular, it is preferable to use the acoustic wave resonator 1 in the present embodiment for the serial resonator 53 having the lowest resonance frequency among a plurality of serial resonators 53.

Here, the conventional SAW resonator 59 is a resonator provided with an IDT electrode exciting the surface acoustic wave. In the resonator, unlike the acoustic wave resonator 1, no bulk wave spurious emission is positioned or three or more bulk wave spurious emissions are positioned between the resonance frequency and the anti-resonance frequency of the surface acoustic wave. That is, between the resonance frequency and the anti-resonance frequency of the surface acoustic wave, zero or five or more resonance frequencies and anti-resonance frequencies of bulk waves are included.

Note that, although not particularly shown, the acoustic wave resonator 1 in the present embodiment may be applied to both of the serial resonators 53 and the parallel resonators 55 as well. In this case, the steepness of change of the amount of attenuation can be improved at the both of the low frequency side and the high frequency side in the passing band. Further, in FIG. 9B and FIG. 9C, only one of the plurality of parallel resonators 55 or only one of the plurality of serial resonators 53 is configured as the acoustic wave resonator 1 in the present embodiment. However, two or more or all of them may be configured as the acoustic wave resonators 1 in the present embodiment as well.

In the case where the acoustic wave resonator 1 in the present embodiment is applied only for the resonators in a portion among one or more serial resonators 53 or one or more parallel resonators 55 as in FIG. 9B and FIG. 9C, for example, frequencies of various bulk wave spurious emissions are kept away from the passing band and the spurious emissions are reduced at the periphery of the passing band in the SAW resonator 59 while obtaining the effect of making the change of amount of attenuation steep at the end of the passing band as described above. Note that, in this case, for example, the frequency difference $\Delta f_s$ of the SAW resonator 59 is positioned in the range surrounded by the lines L21 to L23 in FIG. 6 due to the piezoelectric substrate 7 being relatively thin (for example the thickness is 1λ to 3λ). Further, conversely, in a case where the acoustic wave resonator 1 in the present embodiment is applied for all or relatively many of the resonators, for example, the effect of making the amount of attenuation steep as described above can be increased.

When the acoustic wave resonator 1 in the present embodiment is applied for only a portion among the plurality of parallel resonators 55 as in FIG. 9B, the acoustic wave resonator 1 is different in the thickness $t_e$ of the electrode portion 5 and in the pitch "p" of the electrode fingers 19 from the other parallel resonators 55 (SAW resonators 59). In the same way, when the acoustic wave resonator 1 in the present embodiment is applied for only a portion among the plurality of serial resonators 53 as in FIG. 9C, the acoustic wave resonator 1 is different in the thickness $t_e$ of the electrode portion 5 and in the pitch "p" of the electrode fingers 19 from the other serial resonators 53 (SAW resonators 59). In general, a SAW resonator 59 of a parallel resonator 55 and a SAW resonator 59 of a serial resonator 53 are the same in the thicknesses $t_e$ of the electrode portions 5.

Accordingly, it is possible to judge whether an acoustic wave resonator 1 in the present embodiment is provided according to whether the plurality of IDT electrodes 11 configuring one or more serial resonators 53 and one or more parallel resonators 55 include a first IDT electrode 11 and a second IDT electrode 11 having a different thickness from that of the first IDT electrode 11. Note that, as already explained, when utilizing a bulk wave spurious emission having a relatively low frequency while employing the material and cut angle etc. of the piezoelectric substrate 7 which are being actually utilized or are easily utilized, a probability that the thickness $t_e$ of the electrode portion 5 becomes thicker and the pitch "p" of the electrode fingers 19 becomes narrower in the acoustic wave resonator 1 compared with a SAW resonator 59 is high.

IDT electrodes 11 having different thicknesses may be suitably formed. For example, after forming and etching a conductive layer for a thick (or thin) IDT electrode 11, a conductive layer for a thin (or thick) IDT electrode 11 may be formed and etched. Further, for example, after forming and etching a conductive layer for forming a portion of the thickness of a thick IDT electrode 11, a conductive layer for forming the remaining thickness of the thick IDT electrode 11 and forming the entire thin IDT electrode may be formed and etched. In a case of formation of the conductive layer through a mask as well, in the same way, the two may be formed in separate steps or the step for a portion for formation of the thick IDT electrode 11 may be made common with the step for formation of the thin IDT electrode 11.

(Examples of Acoustic Wave Filter)

The specific conditions of the filter 51 were assumed and its filter characteristics were checked. The filter 51 was configured as one having three resonators of a serial resonator 53A, parallel resonator 55A, and parallel resonator 55B. In the examples, the acoustic wave resonator 1 in the present embodiment was applied to the parallel resonator 55A. In the comparative examples, all resonators were configured as usual SAW resonators 59. Further, for two types of cases (Case 1 and Case 2) in which use was made of $\Delta f_2$ shown in FIG. 3 as the difference $\Delta f$ of frequencies and the magnitudes of them were made different, models of the examples and comparative examples were fabricated, simulation calculations were carried out, and the results thereof were compared.

The conditions (mainly design values) of the Case 1 (Comparative Example 1 and Example 1) will be shown below.

Piezoelectric substrate:
Material: Lithium tantalate single crystal
Cut angle: 42° Y-plate
Thickness $t_s$: 2 μm
Support substrate: Silicon
IDT electrode:
Material: Al—Cu alloy
Thickness $t_e$:
  Comparative Example 1: 121 nm
  Example 1: 181 nm
Pitch "p" of electrode fingers:
  Comparative Example 1: 0.79115 m
  Example 1: 0.75325 m
Duty ratio of electrode fingers: 0.5

In Case 2 (Example 2), the pitch "p", thickness $t_e$, etc. were adjusted so that $\Delta f_2$ became further smaller than that in Case 1.

Figure 10A:
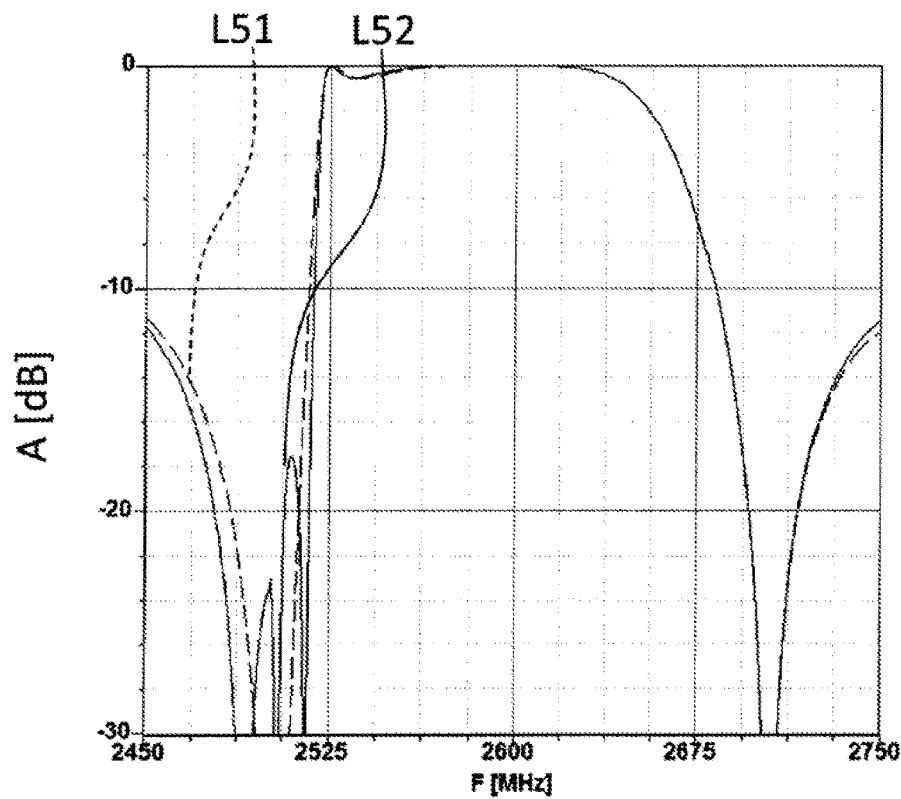
FIG. 10A and FIG. 10B are graphs showing the characteristics of examples of a ladder type filter.
Figure 10B:
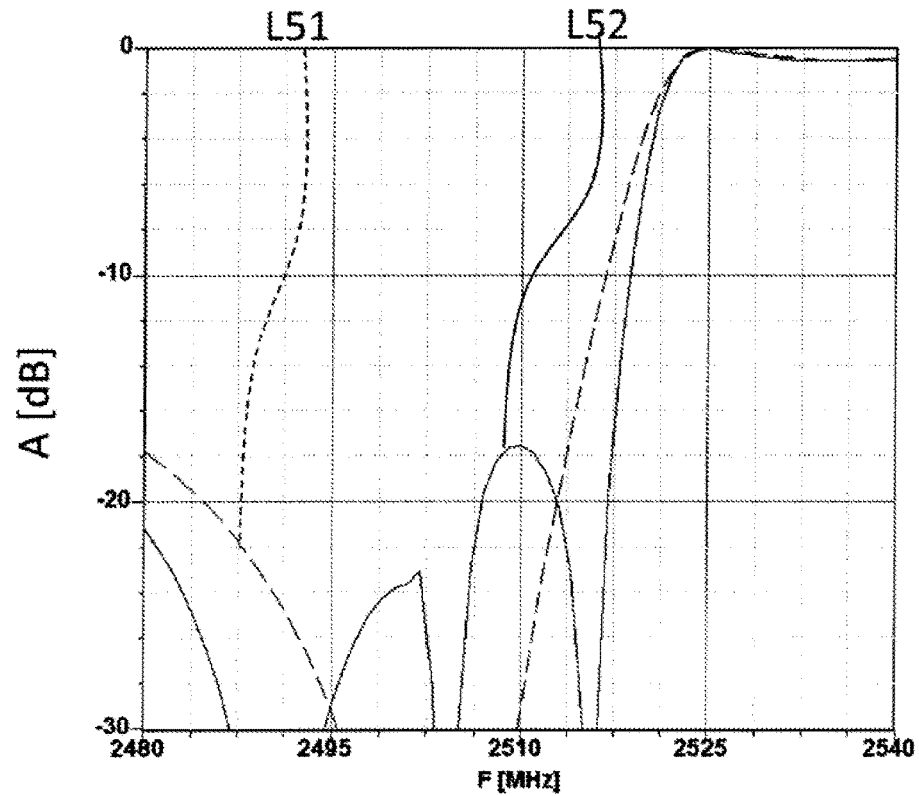

FIG. 10A and FIG. 10B show simulation results of filter characteristics in Case 1.

In these graphs, the abscissas indicate the frequencies F (MHz), and the ordinates indicate the amounts of attenuation A (dB). FIG. 10B is an enlarged graph of the low frequency side in FIG. 10A. In FIG. 10A and FIG. 10B, the line L51 indicates Comparative Example 1, and the line L52 indicates Example 1.

As shown in these graphs, it was confirmed that, even if using an acoustic wave resonator 1 which does not grasp a bulk wave spurious emission as a spurious emission, but utilizes a bulk wave spurious emission as a resonance point or anti-resonance point for the filter 51, the filter 51 functioned as a filter in the same way as a filter 51 configured by only the usual SAW resonator 59. Further, it was confirmed that, by making the frequency difference $\Delta f$ narrow, the effect of making the change of amount of attenuation (rise on the low frequency side in the present embodiment) steep on the end of the passing band was obtained.

Below, results of comparison of the numerical values between Comparative Example 1 and Example 1 will be shown.

|  | Comparative Example 1 | Example 1 |
|---|---|---|
| $f_L$ (MHz) | 2392.5 | 2391.3 |
| $f_A$ (MHz) | 2384.4 | 2387.2 |
| $f_D$ (MHz) | 8.1 | 4.1 |
| dB/$f_D$ | 1.16 | 2.29 |

Here, $f_L$ is the frequency at the time when the amount of attenuation is 0.6 dB, $f_A$ is the frequency when the amount of attenuation is 10 dB, and $f_D$ is $f_L - f_A$. Accordingly, the smaller the $f_D$, the higher the steepness. Further, dB/$f_D$ is the ratio obtained by dividing 9.4 (=10−0.6) dB by $f_D$ (MHz).

It was confirmed from the above numerical values that the steepness became higher in Example 1 relative to Comparative Example 1. Specifically, for dB/$f_D$ of the two, (Example 1)/(Comparative Example 1)×100≈2.29/1.16× 100≈198%, therefore the steepness becomes about two times greater.

In Example 2, compared with Example 1, the magnitude of $\Delta f_2$ was adjusted considering the attenuation characteristic on the lower frequency side. In the case of Example 2, it was confirmed that the attenuation characteristic on the low frequency side outside of the passing band of the filter could be improved.

Note that, when paying attention to a shoulder characteristic on the low frequency side in the passing band, it was confirmed that the steepness was lowered more than that in Example 1, but the steepness was improved compared with Comparative Example 1. In this way, by adjusting the magnitude of $\Delta f_2$, not only the shoulder characteristic, but also the attenuation characteristic outside of the passing band can be improved.

(Multiplexer)

Figure 11:
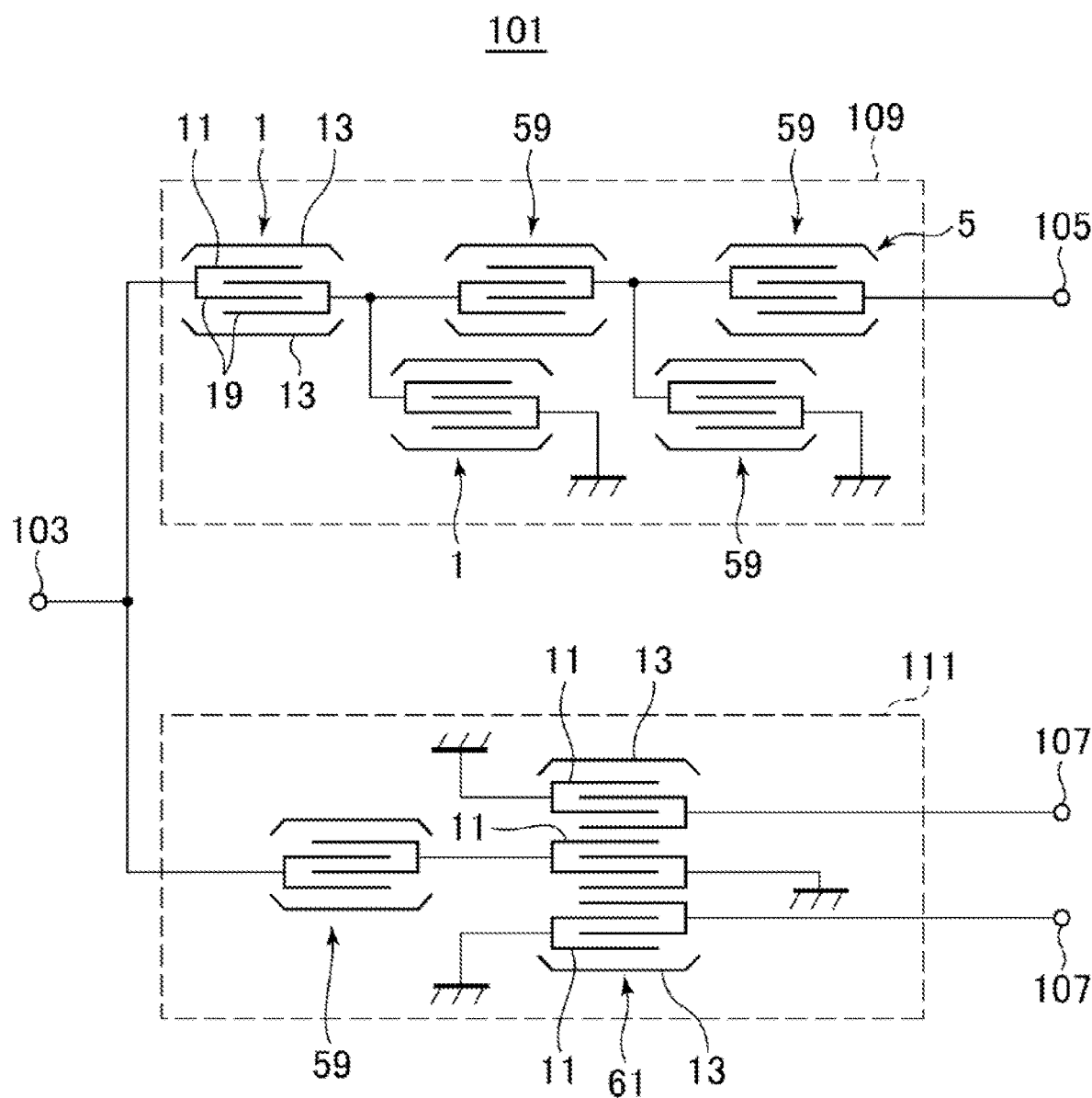
FIG. 11 A schematic view showing a multiplexer as an example of utilization of a ladder type filter.

FIG. 11 is a schematic view showing a multiplexer 101 as an example of utilization of the acoustic wave resonator 1.

The multiplexer 101 for example has a transmission filter 109 which filters a transmission signal from a transmission terminal 105 and outputs the result to an antenna terminal 103 and has a receiving filter 111 which filters a reception signal from the antenna terminal 103 and outputs the result to a pair of reception terminals 107.

The transmission filter 109 is for example given the same configuration as that of the acoustic wave filter 51 explained with reference to FIG. 9A. That is, the transmission filter 109 has one or more serial resonators and one or more parallel resonators which are connected in a ladder configuration. Further, at least one of these resonators is configured by the acoustic wave resonator 1. In the example in FIG. 11, a case where one serial resonator and one parallel resonator are configured by acoustic wave resonators 1, and the other serial resonators and other parallel resonator are configured by conventional SAW resonators 59 is exemplified. The IDT electrodes 11 and pairs of reflectors 13 (electrode portions 5) configuring these plurality of resonators are for example provided on the same piezoelectric substrate 7.

The receiving filter 111 is for example configured by a SAW resonator 59 and SAW filter 61 connected in series to each other. The IDT electrodes 11 and pairs of reflectors 13 configuring them are for example provided on the same piezoelectric substrate 7. The piezoelectric substrate 7 on which the receiving filter 111 is configured may be the same as, or may be different from, the piezoelectric substrate 7 on which the transmission filter 109 is configured.

The SAW filter 61 is for example a longitudinal coupled multiplex mode (including double mode) type resonator filter and has a plurality of IDT electrodes 11 aligned in the direction of propagation of the SAW and a pair of reflectors 13 which are arranged on the two sides thereof.

(Communication Apparatus)

Figure 12:
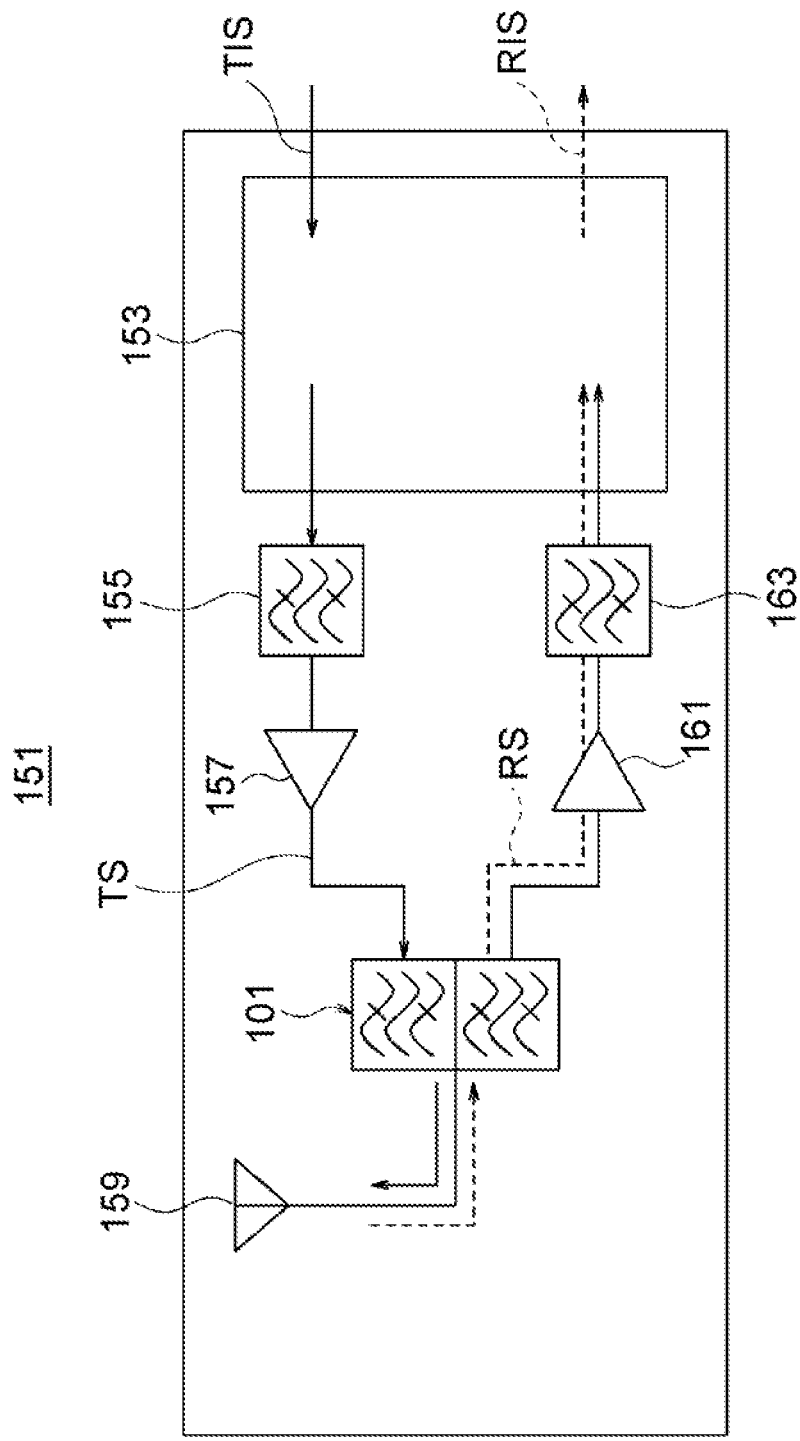
FIG. 12 A block diagram showing a communication apparatus as an example of utilization of a multiplexer.

FIG. 12 is a block diagram showing a principal part of a communication apparatus 151 as an example of utilization of the acoustic wave resonator 1.

The communication apparatus 151 performs wireless communications utilizing radio waves. The communication apparatus 151 utilizes the acoustic wave resonator 1 by having the multiplexer 101 explained above. Specifically, this is as follows.

In the communication apparatus 151, a transmitting information signal TIS including information to be transmitted is modulated and boosted in frequency (converted to high frequency signal having a carrier wave frequency) by an RF-IC (radio frequency integrated circuit) 153 to be made the transmission signal TS. The transmission signal TS is stripped of unwanted components other than the transmission-use passband by a band pass filter 155, is amplified by an amplifier 157, and is input to the multiplexer 101 (transmission terminal 105). Further, the multiplexer 101 strips unwanted components other than the transmission-use passband from the input transmission signal TS and outputs the stripped down transmission signal TS from the antenna terminal 103 to the antenna 159. The antenna 159 converts the input electrical signal (transmission signal TS) to a wireless signal (radio waves) and transmits the result.

Further, in the communication apparatus 151, the wireless signal (radio waves) received by the antenna 159 is converted to an electrical signal (reception signal RS) by the antenna 159 and is input to the multiplexer 101. The multiplexer 101 strips unwanted components other than the reception-use passband from the input reception signal RS and outputs the result to the amplifier 161. The output reception signal RS is amplified by the amplifier 161 and is stripped of the unwanted components other than the reception-use passband by the band pass filter 163. Further, the reception signal RS is lowered in frequency and demodulated by the RF-IC 153 to become the reception information signal RIS.

Note that, the transmitting information signal TIS and the reception information signal RIS may be low frequency signals (baseband signals) containing suitable information and are for example analog audio signals or digital audio signals. The passband of the wireless signal may be one according to various standards such as the UMTS (Universal Mobile Telecommunications System). Usually, the passband for transmission and the passband for reception do not overlap each other. The modulation method may be either of phase modulation, amplitude modulation, frequency modulation, or a combination of two or more selected from among them. As the circuit system, FIG. 12 exemplified a direct conversion method. However, a suitable one other than that may be employed as well. For example, it may be a double super-heterodyne method as well. Further, FIG. 12 schematically shows only the principal part. A low pass filter or isolator etc. may be added at suitable positions. Further, positions of the amplifier etc. may be changed as well.

As described above, in the present embodiment, the acoustic wave resonator 1 has the piezoelectric substrate 7 and the IDT electrode 11 positioned on the top surface of the piezoelectric substrate 7. Further, between the resonance frequency $f_{sr}$ and the anti-resonance frequency $f_{sa}$ due to the SAW, at least one of the resonance frequency $f_{br}$ and anti-resonance frequency $f_{ba}$ due to the bulk wave is positioned.

Accordingly, as explained with reference to FIG. 3B, the resonance characteristic of the frequency difference $\Delta f_1$ can be realized by the SAW resonance frequency $f_{sr}$ and the bulk wave anti-resonance frequency $f_{ba}$ or the resonance characteristic of the frequency difference $\Delta f_2$ can be realized by the bulk wave resonance frequency $f_{br}$ and the SAW anti-resonance frequency $f_{sa}$. Further, $\Delta f_1$ or $\Delta f_2$ is narrower than the difference $\Delta f_s$ of frequency between the SAW resonance frequency $f_{sr}$ and the SAW anti-resonance frequency $f_{sa}$. Therefore, compared with a SAW resonator, a resonance characteristic having a narrow frequency difference $\Delta f$ is realized. The acoustic wave resonator 1 in the present embodiment utilizes a bulk wave which is handled as a spurious emission in a SAW resonator for realization of the resonance characteristic according to a reverse idea. This is epoch-making. Further, the acoustic wave resonator 1, unlike a conventional SAW resonator or bulk wave resonator, is not predicated on one type of acoustic wave, but utilizes two types of acoustic waves (SAW and bulk wave). This is epoch-making also on this point.

Further, in the present embodiment, the acoustic wave filter 51 has one or more serial resonators 53 and one or more parallel resonators 55 which are connected in a ladder configuration. At least one of these resonators is configured by the acoustic wave resonator 1 of the present embodiment.

Accordingly, the acoustic wave resonator 1 having a narrow frequency difference $\Delta f$ is included. Therefore, as explained with reference to FIG. 10A and FIG. 10B, the rise or fall of the amount of attenuation at the end of the passing band can be made steep, therefore the filter characteristics are improved. Specifically, so long as at least one of the one or more parallel resonators 55 is configured by the acoustic wave resonator 1 in the present embodiment, the rise of the amount of attenuation on the low frequency side in the passing band can be made steep. Further, if at least one of the one or more serial resonators 53 is configured by the acoustic wave resonator 1 in the present embodiment, the fall of the amount of attenuation on the high frequency side in the passing band can be made steep.

Further, from another viewpoint, in the present embodiment, the acoustic wave filter 51 has the piezoelectric substrate 7, the support substrate 9 bonded to the bottom surface of the piezoelectric substrate 7, and the plurality of IDT electrodes 11 which are positioned on the top surface of the piezoelectric substrate 7 and configure one or more serial resonators 53 and one or more parallel resonators 55 which are connected in a ladder configuration. The plurality of IDT electrodes 11 include the first IDT electrode 11 (IDT electrode 11 configuring the SAW resonator 59) and the second IDT electrode 11 (IDT electrode 11 configuring the acoustic wave resonator 1) which is different in thickness from the first IDT electrode 11 (for example thicker than the first IDT electrode 11).

Accordingly, it is possible to use the first IDT electrode 11 to configure a usual SAW resonator 59 in which the bulk wave spurious emission is not positioned between the SAW resonance frequency and the SAW anti-resonance frequency while use the second IDT electrode 11 to configure an acoustic wave resonator 1 in the present embodiment in which the bulk wave spurious emission is positioned between the SAW resonance frequency and the SAW anti-resonance frequency. By provision of the acoustic wave resonator 1, various effects explained above are obtained. Further, by mixing a SAW resonator 59 and an acoustic wave resonator 1, the combination of merits of the two becomes possible.

Further, in the present embodiment, the method of design of the acoustic wave resonator 1 has an electrode thickness setting step (steps ST3 to ST5) of specifying the thickness $t_e$ of the electrode fingers 19 where the resonance frequency $f_{sr}$ and anti-resonance frequency $f_{sa}$ due to the SAW are positioned on the two sides of at least one of the resonance frequency $f_{br}$ and the anti-resonance frequency $f_{ba}$ due to the bulk wave in the case where the pitch "p" of the electrode fingers 19 in the IDT electrode 11 is a predetermined initial value, and a step (steps ST6 to ST8. Here, as already explained, steps ST6 and ST9 may be viewed as the same.) specifying the pitch "p" of the electrode fingers 19 with which either frequency described above ($f_{br}$ or $f_{ba}$) coincides with the predetermined target frequency by the thickness $t_e$ of the electrode finger 19 specified in the electrode film thickness setting step.

Accordingly, first, the acoustic wave resonator 1 in the present embodiment in which at least one of the bulk wave resonance frequency $f_{br}$ and the bulk wave anti-resonance frequency $f_{ba}$ is positioned between the SAW resonance frequency $f_{sr}$ and the SAW anti-resonance frequency $f_{sa}$ is realized. Further, if the thickness $t_e$ of the electrode finger 19 is changed, the SAW resonance frequency $f_{sr}$ and the SAW anti-resonance frequency $f_{sa}$ change, but almost no change occurs in the frequency of the bulk wave spurious emission. Therefore, it is easy to realize the desired frequency difference Δf. On the other hand, if the pitch "p" is changed, the frequencies of the standing waves of the SAW and bulk wave can be changed by substantially equal amounts. Therefore, by setting the pitch "p" after setting the thickness $t_e$, a desired combination of the frequency difference Δf and the frequencies on the two ends thereof can be realized easily and conveniently as a whole.

(Modifications)

Figure 13A:
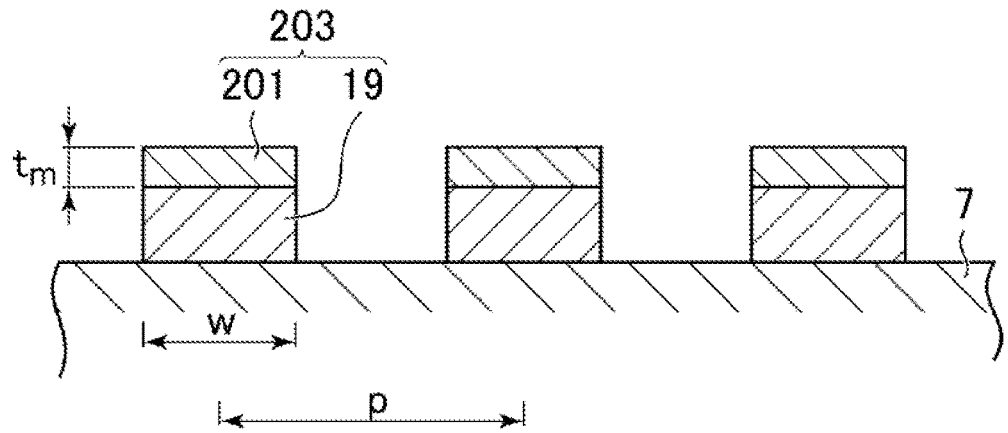
FIG. 13A to FIG. 13C are schematic views for showing various modifications.
Figure 13B:
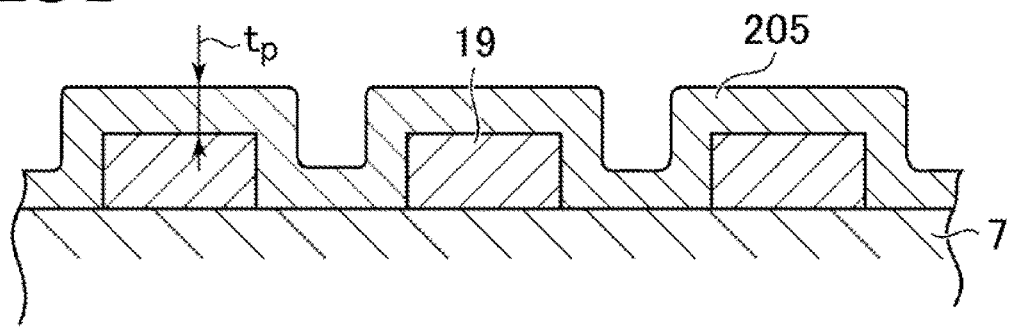
Figure 13C:
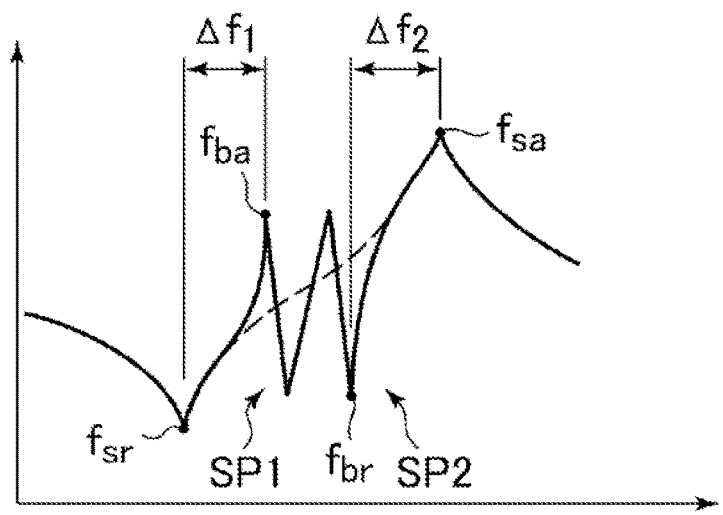

FIG. 13A to FIG. 13C show various modifications of the acoustic wave resonator 1 in the present embodiment in which at least one of the bulk wave resonance frequency $f_{br}$ and bulk wave anti-resonance frequency $f_{ba}$ is positioned between the SAW resonance frequency $f_{sr}$ and the SAW anti-resonance frequency $f_{sa}$.

As shown in FIG. 13A, an additional film 201 given a substantially equal shape to the shape of the electrode fingers 19 (electrode portion 5) in a plane view may be provided on the electrode fingers 19 (electrode portion 5) as well. The additional film 201 may be made of a conductor or may be made of an insulator. Note that, it is also possible to provide the additional film 201 under the electrode fingers 19.

Such an additional film 201 contributes to an increase of the reflection coefficient of the acoustic wave in the electrode fingers 19. In particular, it is effective at the time when a not shown protective layer is formed thicker than the electrode finger 19 and the material of the protective layer (for example $SiO_2$) and the material of the electrode fingers 19 (for example Al or Al alloy) are acoustically close. If the additional film 201 is made of an insulator, the additional film 201 does not always have to have the completely the same shape as the shape of the electrode portion 5 when viewed on a plane. For example, it may have portions positioned between the electrode fingers 19 and the dummy electrodes 21 (FIG. 1) as well.

In a configuration having the additional film 201, the same effect as that by making the thickness $t_e$ of the electrode finger 19 thick can be obtained even by formation of the additional film 201 given a thickness $t_m$ made thick. That is, the resonance frequency and anti-resonance frequency due to the SAW can be changed without changing the frequency of the bulk wave spurious emission so much. Note that, it may also be grasped that the electrode fingers 203 are configured by the electrode fingers 19 (metal layer) and an additional film 201 (may be conductor or insulator).

In the embodiments, by changing the thickness $t_e$ of the electrode finger 19 (or 201), the resonance frequency and anti-resonance frequency due to the SAW were changed and the frequency having a high excitation efficiency of bulk wave spurious emission was shifted without changing the frequency of the bulk wave spurious emission so much. On the other hand, there are various parameters exerting the same effect other than these. Accordingly, in addition to or in place of the change of the thickness $t_e$, the other parameters may be suitably set and the acoustic wave resonator 1 in the present embodiment realized by this.

For example, even if the width "w" (duty ratio w/p) of the electrode finger 19 is changed, the same effect as that in the case where the thickness $t_e$ of the electrode finger 19 is changed can be obtained. Specifically, when making the duty ratio w/p large, in the same way as the case where the thickness $t_e$ of the electrode finger 19 is made thick, without changing the frequency of bulk wave spurious emission so much, the resonance frequency and anti-resonance frequency due to the SAW can be made low and the frequency at which the excitation efficiency of bulk wave spurious emission is high can be shifted to the low frequency side.

However, the effect of lowering the resonance frequency and anti-resonance frequency due to the SAW and so on is more remarkable in the case of change of the thickness $t_e$ of the electrode fingers 19 than the case of change of the duty ratio of the electrode fingers 19. Further, if the duty ratio is made too large, short-circuiting is liable to occur, therefore there is a limit to the amount of adjustment.

Further, for example, as shown in FIG. 13B, in the case where the top surface of the piezoelectric substrate 7 is covered by the protective layer 205 from the top of the electrode portion 5, the same effect as that in the case of change of the thickness $t_e$ of the electrode fingers 19 can be obtained even if changing the thickness $t_p$ of the protective layer 205. Specifically, if the thickness $t_p$ of the protective layer 205 is made thick, in the same way as the case where the thickness $t_e$ of the electrode fingers 19 is made thick, the resonance frequency and anti-resonance frequency due to the SAW can be made low without changing the frequency of the bulk wave spurious emission so much, and the frequency at which the excitation efficiency of the bulk wave spurious emission is high can be shifted to the low frequency side.

Further, although not particularly shown, by changing the cut angle of the piezoelectric substrate 7, the frequency at which the excitation efficiency of bulk wave is high can be shifted. The magnitude of the bulk wave can be adjusted by this as well. For example, in a Y-plate of a lithium tantalate single crystal, the frequency at which the excitation efficiency of the bulk wave is high shifts to a higher frequency side as the cut angle is made larger.

In the embodiments, only one bulk wave spurious emission was positioned between the SAW resonance frequency $f_{sr}$ and the SAW anti-resonance frequency $f_{sa}$. However, as shown in FIG. 13C, two bulk wave spurious emissions (two bulk wave spurious emissions SP1 and SP2 in the shown example) may be positioned between the SAW resonance frequency $f_{sr}$ and the SAW anti-resonance frequency $f_{sa}$ as well. In this case as well, the resonance characteristic of the frequency difference $\Delta f_1$ can be realized due to the SAW resonance frequency $f_{sr}$ and the anti-resonance frequency $f_{ba}$ of the bulk wave spurious emission SP1, and the resonance characteristic of the frequency difference $\Delta f_2$ can be realized by the resonance frequency $f_{br}$ of the bulk wave spurious emission SP2 and the SAW anti-resonance frequency $f_{sa}$.

If the number of the bulk wave spurious emissions becomes three or more (if the number of the resonance frequencies and anti-resonance frequencies of the bulk wave becomes five or more), adjustment by the film thickness and pitch of the IDT electrodes substantially becomes difficult. Note that, when there are two bulk wave spurious emissions, the two of them may be utilized as shown in FIG. 13C or either may be positioned in the vicinity of the resonance frequency or anti-resonance frequency of the surface acoustic wave to reduce its influence or may be positioned at a frequency at which the excitation efficiency of the bulk wave is extremely low to reduce its influence.

Further, although not particularly shown, in the bulk wave spurious emission, both of the resonance frequency $f_{br}$ and the anti-resonance frequency $f_{ba}$ do not have to be positioned between the SAW resonance frequency $f_{sr}$ and the SAW anti-resonance frequency $f_{sa}$. For example, if the resonance characteristic of the difference $\Delta f_1$ of the frequencies is to be realized, the bulk wave anti-resonance frequency $f_{ba}$ only has to be positioned between the SAW resonance frequency $f_{sr}$ and the SAW anti-resonance frequency $f_{sa}$. If the resonance characteristic of the difference $\Delta f_2$ of the frequencies is to be realized, the bulk wave resonance frequency $f_{br}$ only has to be positioned between the SAW resonance frequency $f_{sr}$ and the SAW anti-resonance frequency $f_{sa}$. Note, in general, the difference of frequency between the bulk wave resonance frequency $f_{br}$ and the bulk wave anti-resonance frequency $f_{ba}$ is narrower than the difference $\Delta f_s$ of frequency between the SAW resonance frequency $f_{sr}$ and the SAW anti-resonance frequency $f_{sa}$. Therefore, realistically, there may be many cases where both of the bulk wave resonance frequency $f_{br}$ and the bulk wave anti-resonance frequency $f_{ba}$ are positioned between the SAW resonance frequency $f_{sr}$ and the SAW anti-resonance frequency $f_{sa}$.

Further, in the embodiments, as the acoustic wave filter 5, the explanation was given by taking as an example a case where the acoustic wave resonator 1 was used in a ladder type filter, but the present invention is not limited to this. For the acoustic wave filter 51, use can be made of the acoustic wave resonator 1 even in a filter provided with the longitudinal coupled type resonators 13 as in the receiving filter 111 shown in FIG. 11.

Figure 14:
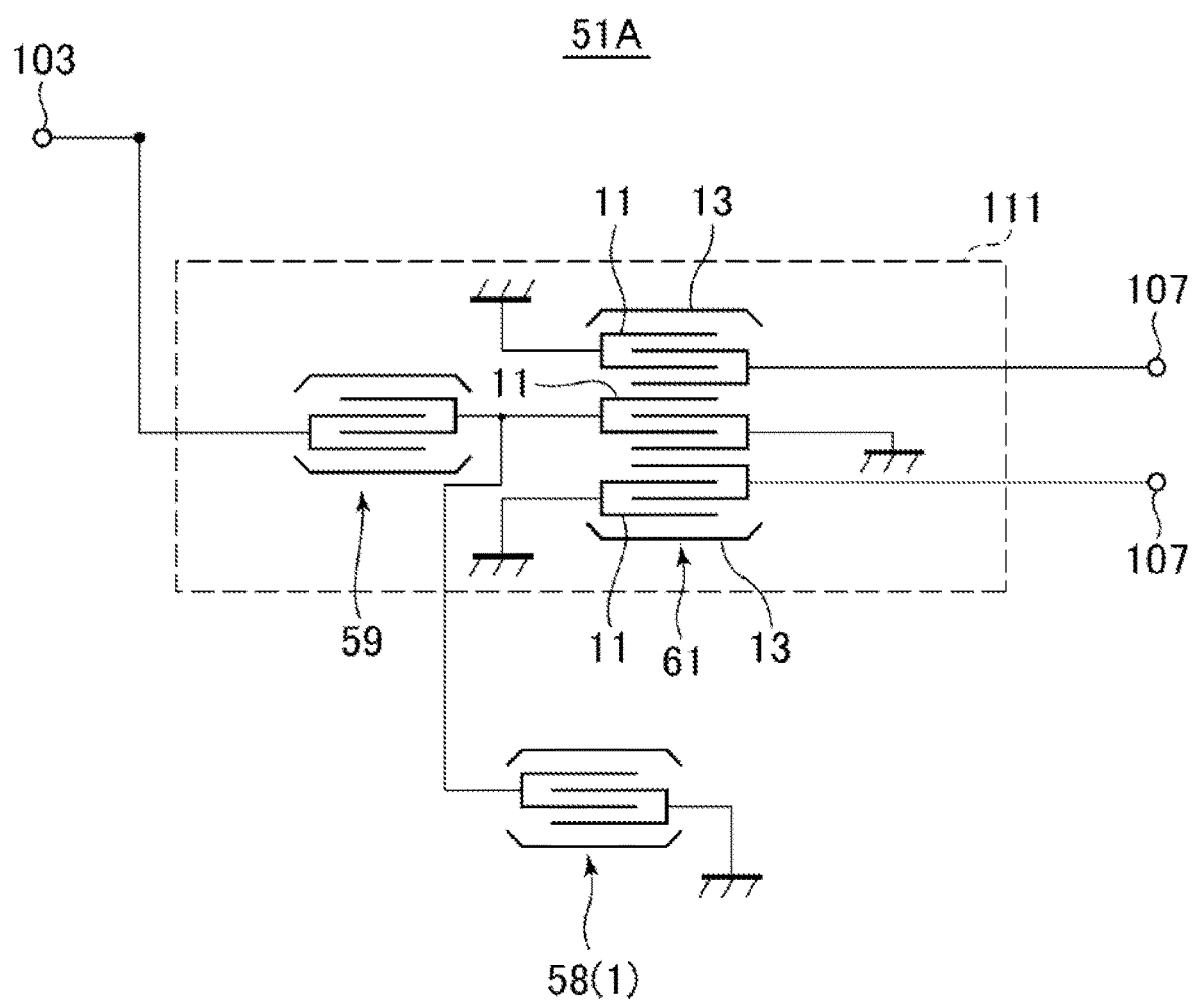
FIG. 14 A schematic view for showing a modification.

Specifically, as shown in FIG. 14, provision may be made of a filter 51A having a longitudinal coupled type (serial connection type) resonator 61 between the terminals 103 and 107, and a parallel resonators 58 arranged between it and the reference potential are provided, and the acoustic wave resonator 1 may be used as this parallel resonator 58.

Such a parallel resonator 58 may be arranged on the side nearer the antenna terminal 103 than the resonator 61 as shown in FIG. 14 or may be arranged on the reception terminal 107 side.

The art according to the present disclosure is not limited to the above embodiments or modifications and may be executed in various ways.

The shape of the IDT electrode is not limited to the one shown. For example, the IDT electrode may be one without dummy electrode fingers as well. Further, for example, the IDT electrode may be a so-called apodized one in which the lengths etc. of the electrode fingers change in the direction of propagation of the SAW. The bus bars may be inclined relative to the direction of propagation of the SAW as well.

In the acoustic wave resonator in the present embodiment, even if not providing a capacity element connected in parallel to the IDT electrode, the difference $\Delta f$ of frequency between the resonance frequency and the anti-resonance frequency can be made narrow. However, a capacity element which is connected in parallel to the IDT electrode may be provided as well.

The bulk wave spurious emission can be generated if the piezoelectric substrate is relatively thin (for example the thickness $t_s$ is 30 μm or less or the normalized thickness $t_s/2p$ is 60 or less). Accordingly, the support substrate is not an essential factor. However, when the support substrate is bonded to the bottom surface of the piezoelectric substrate, for example, in the manufacturing process, the strength of a wafer for production of multiple acoustic wave resonators (thin piezoelectric substrates) can be improved. Further, the support substrate need not have a temperature compensation function either.

The bulk wave spurious emission utilized for the resonance point or anti-resonance point is not limited to the bulk wave spurious emission having the lowest frequency (for example line L21 in FIG. 6). For example, the bulk wave spurious emission having the second lowest frequency (for example line L22 or line L23 in FIG. 6) may be utilized as well.

In the method of design explained with reference to FIG. 8, the resonance characteristics were estimated by simulation calculations and various dimensions (thickness $t_e$ and pitch "p" in the embodiment) satisfying various conditions (steps ST3, ST6, and ST9) were specified. Note, in addition to or place of the simulation calculations, a prototype may be prepared and its resonance characteristics may be measured, and various dimensions satisfying the conditions may be specified. That is, the method of design in the present embodiment is not limited to one realized by software.

In the method of design in the embodiment, various dimensions satisfying the conditions were specified by the idea of assuming various dimensions of the usual SAW resonator and changing these dimensions. However, considering the influence of various dimensions exerted upon the SAW and bulk wave, various dimensions of the acoustic wave resonator may also be calculated from the beginning or adjusted based on the results of calculation.

REFERENCE SIGNS LIST

1 . . . acoustic wave resonator, 3 . . . bonded substrate, 7 . . . piezoelectric substrate, 9 . . . support substrate, 11 . . . IDT electrode, $f_{sr}$ . . . SAW resonance frequency, $f_{sa}$ . . . SAW anti-resonance frequency, $f_{br}$ . . . bulk wave resonance frequency, $f_{ba}$ . . . bulk wave anti-resonance frequency, and SP0 . . . bulk wave spurious emission.

The invention claimed is:

1. An acoustic wave resonator comprising:
   a piezoelectric substrate; and
   an IDT electrode on a top surface of the piezoelectric substrate,
   wherein between a resonance frequency and anti-resonance frequency due to a surface acoustic wave, one to four of at least one of resonance frequencies or anti-resonance frequencies due to bulk waves are located, and
   wherein at least one of the resonance frequency or anti-resonance frequency due to the bulk wave comprising the lowest frequency is located between the resonance frequency and the anti-resonance frequency due to the surface acoustic wave.

2. An acoustic wave filter comprising one or more serial resonators and one or more parallel resonators which are connected in a ladder configuration, wherein at least one of the one or more serial resonators and the one or more parallel resonators is configured by the acoustic wave resonator according to claim 1.

3. The acoustic wave filter according to claim 2, wherein at least one of the one or more serial resonators is configured by the acoustic wave resonator.

4. A multiplexer comprising:
   an antenna terminal,
   a transmission filter which filters a transmission signal and outputs the result to the antenna terminal, and
   a receiving filter which filters the reception signal from the antenna terminal,
   wherein at least one of the transmission filter and the receiving filter comprises the acoustic wave filter according to claim 2.

5. A communication apparatus comprising:
   an antenna,
   the multiplexer according to claim 4 in which the antenna terminal is connected to the antenna, and an IC connected to the transmission filter and the receiving filter.

6. An acoustic wave filter comprising:
at least one acoustic wave resonator according to claim 1;
a support substrate bonded to a bottom surface of the piezoelectric substrate; and
a plurality of IDT electrodes on the top surface of the piezoelectric substrate,
wherein the plurality of IDT electrodes comprises
a first IDT electrode, and
a second IDT electrode which is different in thickness from the first IDT electrode.

7. The acoustic wave filter according to claim 6, wherein the plurality of IDT electrodes configure a longitudinal coupled resonator and a parallel resonator connected between the longitudinal coupled resonator and a reference potential, the first IDT electrode configures the parallel resonator, and the second IDT electrodes configure the longitudinal coupled resonator.

8. An acoustic wave resonator comprising:
a piezoelectric substrate; and
an IDT electrode on a top surface of the piezoelectric substrate,
wherein between a resonance frequency and anti-resonance frequency due to a surface acoustic wave, one to four of at least one of resonance frequencies or anti-resonance frequencies due to bulk waves are located, and
wherein when a pitch of the electrode fingers in the IDT electrode is "p" and a thickness of the electrode fingers is "te", a normalized thickness te/2p of the electrode finger exceeds 0.08.

9. The acoustic wave resonator according to claim 8, wherein the pitch of electrode fingers in the IDT electrode is smaller than half of a wavelength obtained by dividing a propagation speed of the surface acoustic wave by the resonance frequency of the surface acoustic wave.

10. An acoustic wave filter comprising:
at least one acoustic wave resonator according to claim 8;
a support substrate bonded to a bottom surface of the piezoelectric substrate; and
a plurality of IDT electrodes on the top surface of the piezoelectric substrate,
wherein the plurality of IDT electrodes comprises
a first IDT electrode, and
a second IDT electrode which is different in thickness from the first IDT electrode.

11. The acoustic wave filter according to claim 10, wherein the plurality of IDT electrodes configure a longitudinal coupled resonator and a parallel resonator connected between the longitudinal coupled resonator and a reference potential, the first IDT electrode configures the parallel resonator, and the second IDT electrodes configure the longitudinal coupled resonator.

12. An acoustic wave resonator comprising:
a piezoelectric substrate; and
an IDT electrode on a top surface of the piezoelectric substrate,
wherein between a resonance frequency and anti-resonance frequency due to a surface acoustic wave, one to four of at least one of resonance frequencies or anti-resonance frequencies due to bulk waves are located, and
wherein
the piezoelectric substrate is a Y-plate which is made of a substrate of a single crystal of lithium tantalate and comprises a cut angle of 38° to 48°, and
when a pitch of the electrode fingers in the IDT electrode is "p" and a thickness of the piezoelectric substrate is "ts", a normalized thickness is/2p of the piezoelectric substrate is 1 to 3.

13. An acoustic wave filter comprising:
at least one acoustic wave resonator according to claim 12;
a support substrate bonded to a bottom surface of the piezoelectric substrate; and
a plurality of IDT electrodes on the top surface of the piezoelectric substrate,
wherein the plurality of IDT electrodes comprises
a first IDT electrode, and
a second IDT electrode which is different in thickness from the first IDT electrode.

14. The acoustic wave filter according to claim 13, wherein the plurality of IDT electrodes configure a longitudinal coupled resonator and a parallel resonator connected between the longitudinal coupled resonator and a reference potential, the first IDT electrode configures the parallel resonator, and the second IDT electrodes configure the longitudinal coupled resonator.

15. An acoustic wave filter comprising:
one or more serial resonators and one or more parallel resonators which are connected in a ladder configuration,
wherein at least one of the one or more serial resonators and the one or more parallel resonators is configured by an acoustic wave resonator comprising
a piezoelectric substrate, and
an IDT electrode on a top surface of the piezoelectric substrate,
wherein between a resonance frequency and anti-resonance frequency due to a surface acoustic wave, one to four of at least one of resonance frequencies or anti-resonance frequencies due to bulk waves are located, and
wherein
the one or more serial resonators and the one or more parallel resonators include a surface acoustic wave resonator comprising an IDT electrode comprising a different thickness from that of the IDT electrode in the acoustic wave resonator, and
in the surface acoustic wave resonator, no resonance frequencies and anti-resonance frequencies due to a bulk wave are located between a resonance frequency and an anti-resonance frequency by a surface acoustic wave, or five or more are located.

16. The acoustic wave filter according to claim 15, wherein the thickness of the IDT electrode in the acoustic wave resonator is thicker than the thickness of the IDT electrode in the surface acoustic wave resonator.

17. The acoustic wave filter according to claim 15, further comprising:
a support substrate bonded to a bottom surface of the piezoelectric substrate; and
a plurality of IDT electrodes on the top surface of the piezoelectric substrate,
wherein the plurality of IDT electrodes comprises
a first IDT electrode, and
a second IDT electrode which is different in thickness from the first IDT electrode.

18. The acoustic wave filter according to claim 17, wherein the plurality of IDT electrodes configure a longitudinal coupled resonator and a parallel resonator connected between the longitudinal coupled resonator and a reference potential, the first IDT electrode configures the parallel resonator, and the second IDT electrodes configure the longitudinal coupled resonator.

19. An acoustic wave filter comprising:
one or more serial resonators and one or more parallel resonators which are connected in a ladder configuration,
wherein at least one of the one or more parallel resonators is configured by an acoustic wave resonator comprising
a piezoelectric substrate, and
an IDT electrode on a top surface of the piezoelectric substrate,
wherein between a resonance frequency and anti-resonance frequency due to a surface acoustic wave, one to four of at least one of resonance frequencies or anti-resonance frequencies due to bulk waves are located.

20. The acoustic wave filter according to claim 19, further comprising:
a support substrate bonded to a bottom surface of the piezoelectric substrate; and
a plurality of IDT electrodes on the top surface of the piezoelectric substrate,
wherein the plurality of IDT electrodes comprises
a first IDT electrode, and
a second IDT electrode which is different in thickness from the first IDT electrode.

21. The acoustic wave filter according to claim 20, wherein the plurality of IDT electrodes configure a longitudinal coupled resonator and a parallel resonator connected between the longitudinal coupled resonator and a reference potential, the first IDT electrode configures the parallel resonator, and the second IDT electrodes configure the longitudinal coupled resonator.

* * * * *